(12) United States Patent
Kitazawa

(10) Patent No.: US 11,387,166 B2
(45) Date of Patent: Jul. 12, 2022

(54) THREE-DIMENSIONAL MEMORY DEVICE WITH VARIABLE WIDTH CONTACT VIA STRUCTURES AND METHODS FOR MAKING THE SAME

(71) Applicant: SANDISK TECHNOLOGIES LLC, Addison, TX (US)

(72) Inventor: Keigo Kitazawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 107 days.

(21) Appl. No.: 16/697,555

(22) Filed: Nov. 27, 2019

(65) Prior Publication Data

US 2021/0159149 A1 May 27, 2021

(51) Int. Cl.
| | |
|---|---|
| *H01L 27/11565* | (2017.01) |
| *H01L 23/48* | (2006.01) |
| *H01L 27/1157* | (2017.01) |
| *H01L 27/11556* | (2017.01) |
| *H01L 27/11582* | (2017.01) |
| *H01L 27/11524* | (2017.01) |

(Continued)

(52) U.S. Cl.
CPC ........ *H01L 23/481* (2013.01); *H01L 27/1157* (2013.01); *H01L 27/11519* (2013.01); *H01L 27/11524* (2013.01); *H01L 27/11548* (2013.01); *H01L 27/11556* (2013.01); *H01L 27/11565* (2013.01); *H01L 27/11573* (2013.01); *H01L 27/11575* (2013.01); *H01L 27/11582* (2013.01)

(58) Field of Classification Search
None
See application file for complete search history.

(56) References Cited

U.S. PATENT DOCUMENTS

| | | |
|---|---|---|
| 9,449,983 B2 | 9/2016 | Yada et al. |
| 9,570,463 B1 | 2/2017 | Zhang et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Grant S Withers
(74) *Attorney, Agent, or Firm* — The Marbury Law Group PLLC

(57) ABSTRACT

Devices are formed on a substrate. A first-tier alternating stack of first insulating layers and first spacer material layers having first stepped surfaces and a first retro-stepped dielectric material portion are formed over the substrate. A sacrificial contact via structure is formed through the first retro-stepped dielectric material portion. A second-tier alternating stack of second insulating layers and second spacer material layers is formed with second stepped surfaces. A second retro-stepped dielectric material portion including a doped silicate glass liner and a silicate glass material portion is formed over the second stepped surfaces. Memory stack structures are formed through the second-tier alternating stack and the first-tier alternating stack. A contact via cavity is formed down to the sacrificial contact via structure. The doped silicate glass liner is recessed and the sacrificial contact via structure is removed, to form a contact via structure in the contact via cavity.

8 Claims, 31 Drawing Sheets

(51) Int. Cl.
*H01L 27/11519* (2017.01)
*H01L 27/11548* (2017.01)
*H01L 27/11573* (2017.01)
*H01L 27/11575* (2017.01)

(56) References Cited

U.S. PATENT DOCUMENTS

| | | | |
|---|---|---|---|
| 9,589,981 B2 | 3/2017 | Nishikawa et al. | |
| 9,646,981 B2 | 5/2017 | Nishikawa et al. | |
| 9,768,192 B1 | 9/2017 | Nakamura | |
| 9,780,034 B1 | 10/2017 | Tsutsumi et al. | |
| 9,991,280 B2 | 6/2018 | Nakamura et al. | |
| 10,056,399 B2 | 8/2018 | Costa et al. | |
| 10,115,732 B2 | 10/2018 | Yu et al. | |
| 10,242,994 B2 | 3/2019 | Inomata et al. | |
| 10,290,645 B2 | 5/2019 | Nakatsuji et al. | |
| 10,354,956 B1 | 7/2019 | Yu et al. | |
| 10,381,434 B1 | 8/2019 | Pachamuthu et al. | |
| 10,475,879 B1 | 11/2019 | Pachamuthu et al. | |
| 10,600,763 B1* | 3/2020 | Xiao | H01L 27/0688 |
| 2010/0090286 A1* | 4/2010 | Lee | H01L 29/792 |
| | | | 257/368 |
| 2018/0269226 A1* | 9/2018 | Sonehara | H01L 27/11573 |
| 2018/0331117 A1 | 11/2018 | Titus et al. | |
| 2019/0273088 A1 | 9/2019 | Cui et al. | |
| 2019/0280000 A1 | 9/2019 | Nakamura et al. | |

OTHER PUBLICATIONS

U.S. Appl. No. 16/552,089, filed Aug. 27, 2019, SanDisk Technologies LLC.

* cited by examiner

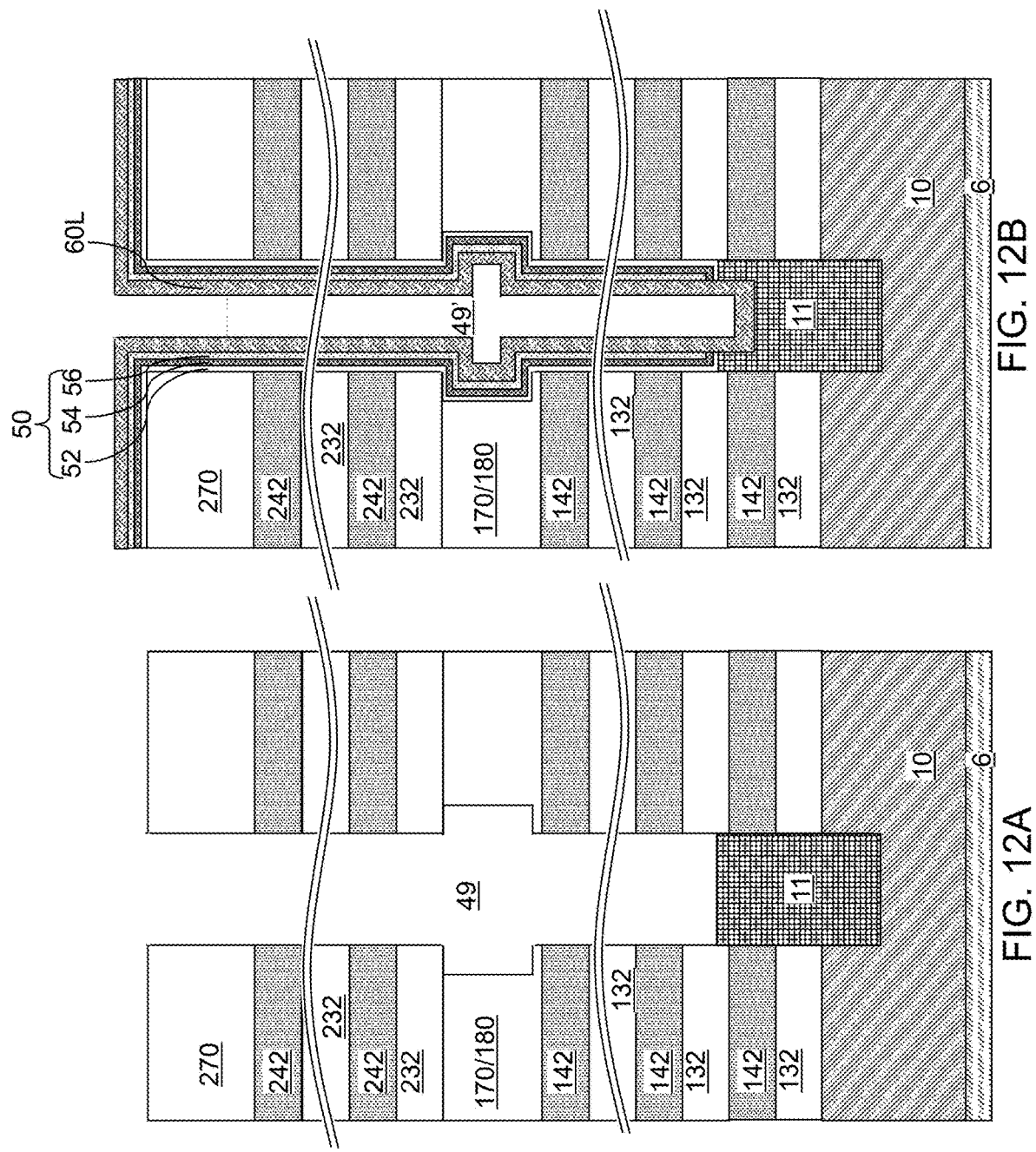

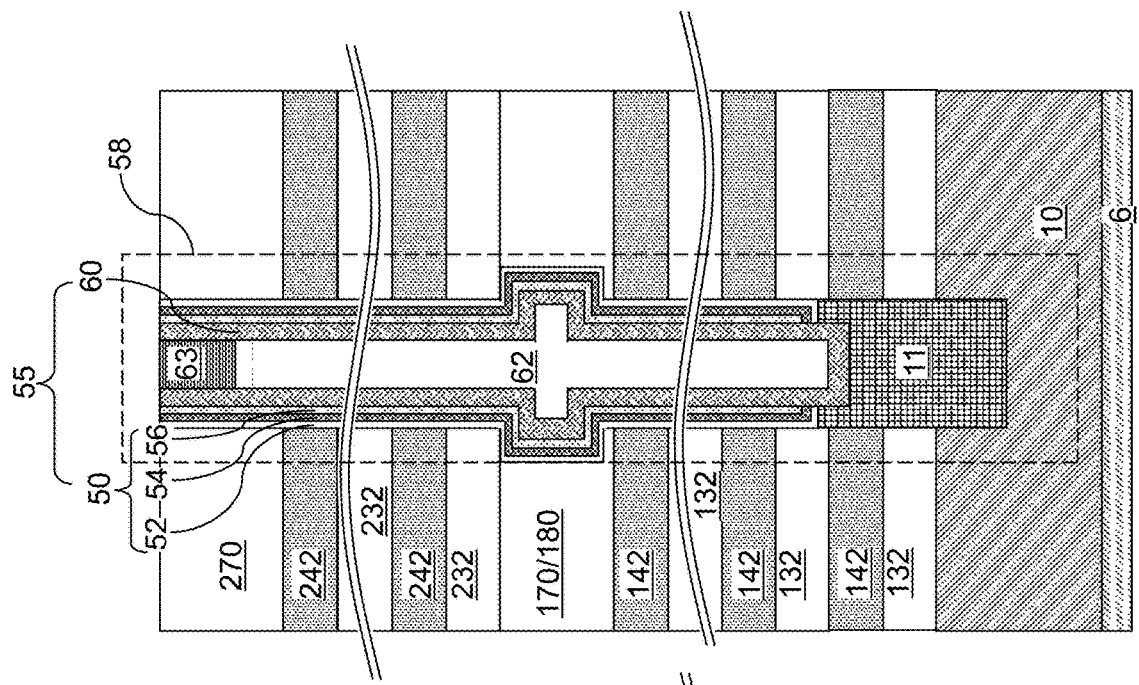
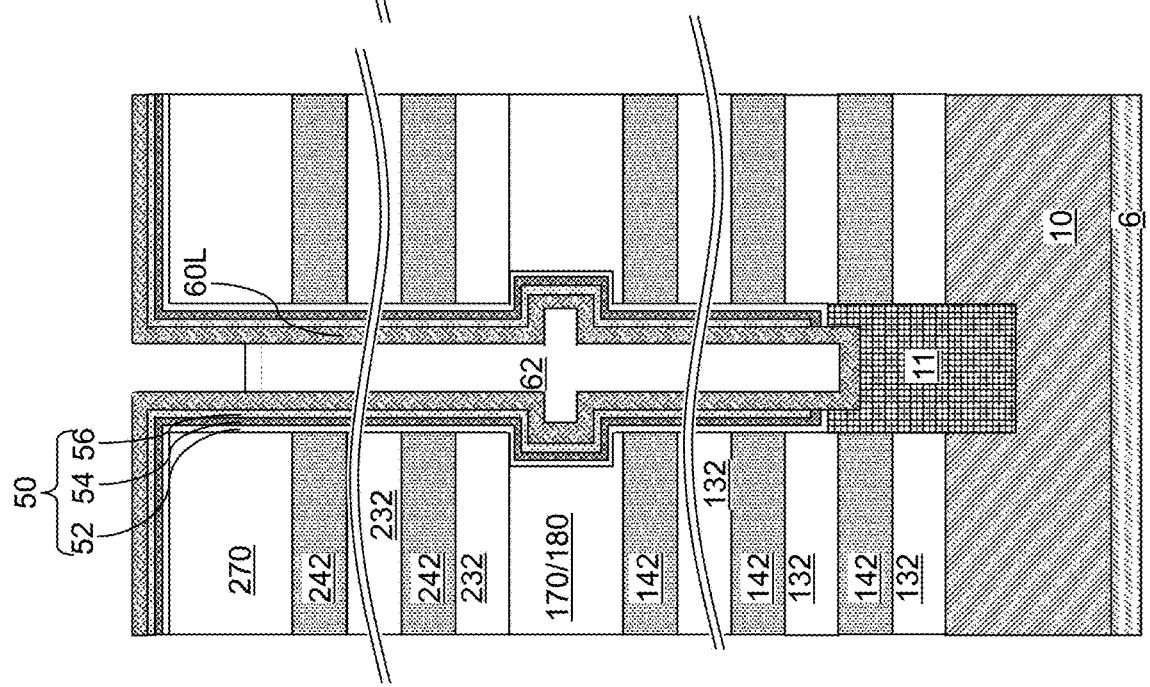

THREE-DIMENSIONAL MEMORY DEVICE WITH VARIABLE WIDTH CONTACT VIA STRUCTURES AND METHODS FOR MAKING THE SAME

FIELD

The present disclosure relates generally to the field of semiconductor devices, and particularly to a three-dimensional memory device containing variable width contact via structures to peripheral devices and methods for making the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure is provided, which comprises: field effect transistors located on a substrate; a three-dimensional memory array located over the substrate, wherein the three-dimensional memory array comprises at least one alternating stack of insulating layers and electrically conductive layers and memory stack structures comprising a vertical semiconductor channel and a memory film that vertically extend through the at least one alternating stack, and wherein the at least one alternating stack comprises stepped surfaces in a staircase region; at least one retro-stepped dielectric material portion overlying the stepped surfaces and the field effect transistors; and a contact via structure extending from a horizontal plane including a topmost surface of the at least one retro-stepped dielectric material portion to a component of the field effect transistors, wherein the contact via structure has: a first portion having a first width at a first height from a horizontal plane including the top surface of the substrate; a second portion having a second width that is greater than the first width at a second height from the horizontal plane that is less than the first height; a third portion having a third width that is greater than the first width at a third height from the horizontal plane that is less than the second height; and a fourth portion having a fourth width that is less than the second width and is less than the third width at a fourth height at which a bottommost surface of the contact via structure is located.

According to another embodiment of the present disclosure, a semiconductor structure includes field effect transistors located on a substrate and a three-dimensional memory array located over the substrate, wherein the three-dimensional memory array comprises a first-tier alternating stack of first insulating layers and first electrically conductive layers, a second-tier alternating stack of second insulating layers and second electrically conductive layers located over the first-tier alternating stack, and memory stack structures comprising a vertical semiconductor channel and a memory film that vertically extend through the first and the second alternating stacks. A retro-stepped dielectric material portion contacts, and overlies, stepped surfaces of the first-tier alternating stack. A doped silicate glass liner includes a sloping portion that contacts the stepped surfaces of the second-tier alternating stack. A silicate glass material portion overlies the doped silicate glass liner and includes a planar top surface and a tapered portion overlying, and vertically spaced from, the stepped surfaces of the second-tier alternating stack. A contact via structure extends to a component of the field effect transistors. The contact via structure comprises a middle portion that is laterally surrounded by the doped silicate glass liner that is wider than a lower portion that is at least partially surrounded by the retro-stepped dielectric material portion and wider than an upper portion that is at least partially surrounded by the silicate glass material portion.

According to another embodiment of the present disclosure, a method of forming a semiconductor structure is provided, which comprises the steps of: forming field effect transistors on a substrate; forming a first-tier alternating stack of first insulating layers and first spacer material layers over the substrate, wherein the first spacer material layers are formed as, or are subsequently replaced with, first electrically conductive layers, and the first-tier alternating stack has first stepped surfaces; forming a first retro-stepped dielectric material portion over the first stepped surfaces; forming a sacrificial contact via structure contacting a component of the field effect transistors through the first retro-stepped dielectric material portion; forming a second-tier alternating stack of second insulating layers and second spacer material layers over the first-tier alternating stack, wherein the second spacer material layers are formed as, or are subsequently replaced with, second electrically conductive layers, and the second-tier alternating stack has second stepped surfaces; forming a second retro-stepped dielectric material portion over the second stepped surfaces, wherein the second retro-stepped dielectric material portion comprises a doped silicate glass liner including a sloping portion that contacts the stepped surfaces of the second-tier alternating stack, and a silicate glass material portion overlying the doped silicate glass liner; forming memory stack structures comprising a vertical semiconductor channel and a memory film through the second-tier alternating stack and the first-tier alternating stack; forming an extension via cavity extending through the second retro-stepped dielectric material portion and the first retro-stepped dielectric material portion and down to the sacrificial contact via structure; laterally expanding the extension via cavity by laterally recessing the doped silicate glass liner selective to the silicate glass material portion; vertically expanding the extension via cavity by removing the sacrificial contact via structure, whereby a contact via cavity including a volume of the extension via cavity and a volume of the sacrificial contact via structure is formed; and forming a contact via structure in the contact via cavity.

BRIEF DESCRIPTION OF THE DRAWINGS

FIGS. 12A-12D illustrate sequential vertical cross-sectional views of a memory opening during formation of a memory opening fill structure according to an embodiment of the present disclosure.

DETAILED DESCRIPTION

Figure 1A:
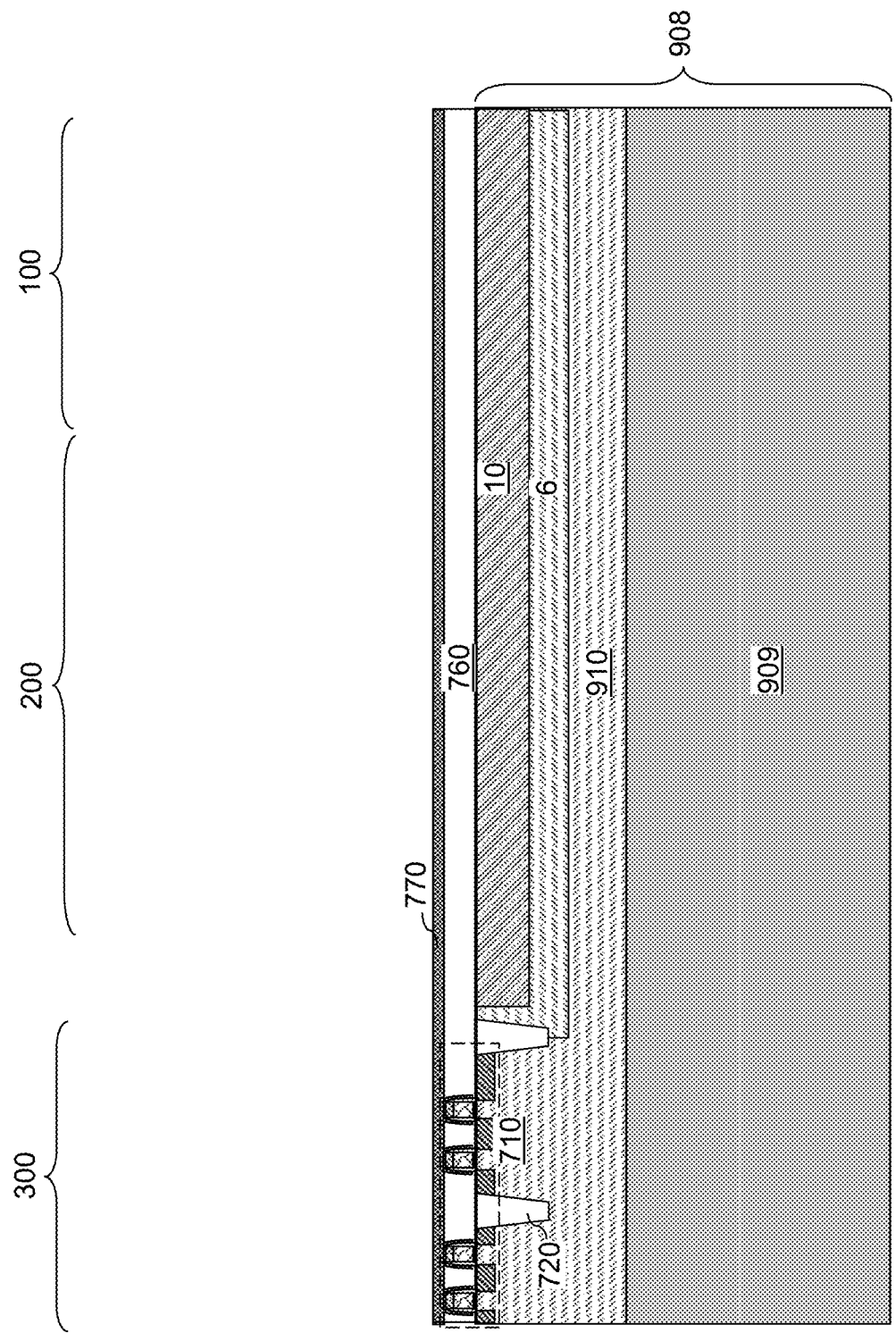
FIG. 1A is a vertical cross-sectional view of a region of an exemplary structure for forming a semiconductor die after formation of various doped semiconductor regions, field effect transistors, a planarization dielectric layer, and an etch stop dielectric layer according to an embodiment of the present disclosure.

The three-dimensional memory devices have a significant thickness, often in a range from 5 microns to 30 microns. Contact via structures extending through the levels of alternating stacks of insulating layers and electrically conductive layers have commensurate heights, and thus, very high aspect ratios. In order to mitigate the effect of the high aspect ratios, the three-dimensional memory devices may be formed as separate tiers, with contact via cavities formed separately in each tier. However, the contact via cavities may be tapered and have a narrow point at the junction between two vertically adjacent tiers. Conformal fill of metallic materials may result in formation of a void within a contact via structure below the narrow point at the joint region in the contact via cavity.

According to an aspect of the present disclosure, local widening of a contact via cavity is used to provide gradual widening in a joint region of the contact via cavity to reduce or eliminate a void in a contact via structure formed in the contact via cavity. As discussed above, the embodiments of present disclosure are directed to contact via structures with variable width having a wider portion at the joint region between the tiers in a three-dimensional memory device and methods for making the same, the various aspects of which are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
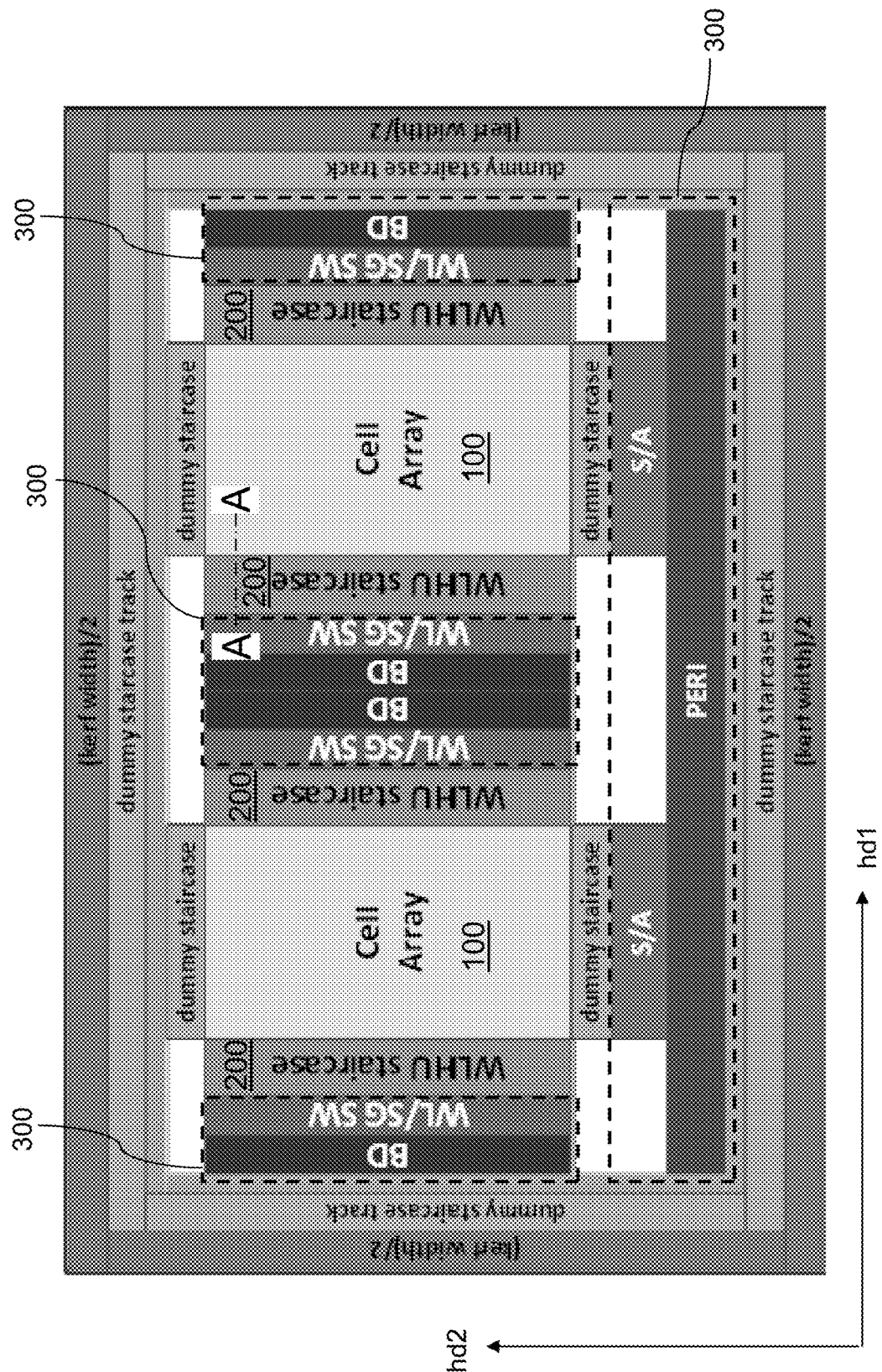
FIG. 1B is a top-down view of a unit die area of the exemplary structure of FIG. 1A.

Referring to FIGS. 1A and 1B, an exemplary structure for forming a semiconductor die is illustrated. FIG. 1B illustrates the layout of various regions within a unit die area of the exemplary structure, and FIG. 1A is a vertical cross-sectional view of the exemplary structure. In one embodiment, the exemplary structure can include a substrate 908, which may be provided by forming various doped semiconductor regions (such as doped wells) in an upper portion of a semiconductor wafer (which may be, for example, a single crystal silicon wafer, such as a 300 mm silicon wafer or a 200 mm silicon wafer). For example, the substrate 908 can include a substrate layer 909, a semiconductor material layer 910, a first doped well 6 that is embedded in the semiconductor material layer 910, and a second doped well 10 that is embedded in the second doped well 6. In an illustrative example, the semiconductor material layer 910 and the second doped well 10 can have p-type doping, and the first doped well 6 can have n-type doping. The substrate layer 909 may be a semiconductor substrate (e.g., silicon wafer), a semiconductor material layer (e.g., an epitaxial silicon layer on silicon wafer), or an insulating layer (as in the case of a semiconductor-on-insulator substrate). Additional doped wells may be formed as needed to provide various semiconductor devices thereupon. Each of the doped wells can be p-doped or n-doped, and can have an atomic concentration of electrical dopants in a range from $1.0 \times 10^{14}/\text{cm}^3$ to $1.0 \times 10^{18}/\text{cm}^3$, although lesser and greater atomic concentrations may also be used.

Various semiconductor devices 710 can be formed on the substrate. The various semiconductor devices 710 can include complementary metal-oxide-semiconductor (CMOS) devices, and can include various peripheral circuits (i.e., driver circuits) that can be used to operate a three-dimensional array of memory elements to be subsequently formed on the substrate 908 within the cell array regions. As used herein, a "cell array region" refers to a region in which a three-dimensional array of memory elements is formed, such as a memory plane. A cell array region (e.g., a memory plane) is also referred to as a memory array region 100. The semiconductor devices 710 can include field effect transistors that are formed on the top surface of the substrate 908.

Generally, the semiconductor devices 710 can include any circuit that can be used to control operation of at least one three-dimensional array of memory elements to be subsequently formed. For example, the semiconductor devices 710 can include peripheral devices that are used to control operation of a three-dimensional array of memory elements to be subsequently formed. The regions in which the peripheral devices are formed are collectively referred to as a peripheral device region 300. The peripheral device region 300 can include various regions configured to provide specific types of peripheral devices. In an illustrative example, sense amplifier circuits can be formed within sense amplifier regions, which are marked as "S/A" in FIG. 1B. Bit line driver circuits can be formed within bit line driver regions, which are marked as "BD" in FIG. 1B. Word line switches and select gate electrode switch can be formed in word line and select gate electrode switch regions, which are marked as "WL/SG SW" in FIG. 1B. Additional miscellaneous peripheral devices can be formed in a miscellaneous peripheral device region, which is marked as "PERI" in FIG. 1B. Each three-dimensional array of memory elements can be subsequently formed employing alternating stacks of insulating layers and electrically conductive layers (e.g., word lines). In this case, the layers within the alternating stacks can be patterned to provide stepped surfaces, and contact via structures contacting a respective one of the electrically conductive layers can be formed in such stepped surfaces. Such regions are referred to as word line hookup staircase regions, and are marked as "WLHU staircase" in FIG. 1B. The word line hookup staircase regions are also referred to as staircase regions 200. Dummy stepped surfaces that are not used to provide electrical contacts to the electrically conductive layers can be formed around each cell array region (i.e., memory array region 100). Regions including such dummy stepped surfaces are herein referred to as dummy staircase regions, and are marked as "dummy staircase" in FIG. 1B. Additional dummy staircase regions can be formed inside a periphery of a die area. The additional dummy staircase regions are herein referred to as "dummy staircase tracks". Seal ring structures and a guard ring structure are subsequently formed at the outer edge of the dummy staircase tracks, which define the outer boundary of a semiconductor chip.

The region in which the seal ring structures and the guard ring structure are subsequently formed is herein referred to as a seal ring and guard ring region. Kerf areas are provided outside the areas of the seal ring structures. The area within an outer periphery of the seal ring and guard ring region defines the area of a semiconductor die to be subsequently formed. The area of the semiconductor die can have a generally rectangular shape. The horizontal direction of a first pair of sidewalls of the semiconductor die is herein referred to as a first horizontal direction hd1 (e.g., word line direction), and the horizontal direction of a second pair of sidewalls of the semiconductor die is herein referred to as a second horizontal direction hd2 (e.g., bit line direction), which is perpendicular to the first horizontal direction hd1. The kerf areas can include various test structures and alignment structures that may, or may not, be destroyed during singulation of the substrate 908 and semiconductor devices thereupon into a plurality of semiconductor dies. The unit die area includes half of the width of each kerf area.

A planarization dielectric layer 760 can be formed over the semiconductor devices 710. For example, the planarization dielectric layer 760 can be formed over gate structures and active regions (such as source regions and drain regions) of the field effect transistors. The planarization dielectric layer 760 can include a planarizable dielectric material such as a silicate glass. The top surface of the planarization dielectric layer 760 can be planarized, for example, by chemical mechanical planarization.

An etch stop dielectric layer 770 can be formed over the planarization dielectric layer 760. The etch stop dielectric layer 770 can include a dielectric material that can be employed as an etch stop material during etching of an overlying dielectric material portion to be subsequently formed. In one embodiment, the etch stop dielectric layer 70 can include at least one dielectric material sublayer including a material that is different from the material of sacrificial material layers of a vertically alternating sequence of insulating layers and sacrificial material layers. For example, if the overlying dielectric material portion includes silicon oxide, the etch stop dielectric layer 770 can include a layer stack of a dielectric metal oxide layer and a silicon nitride layer. In one embodiment, the etch stop dielectric layer 770 can include a layer stack of a silicon nitride layer and an aluminum oxide layer.

Figure 2:
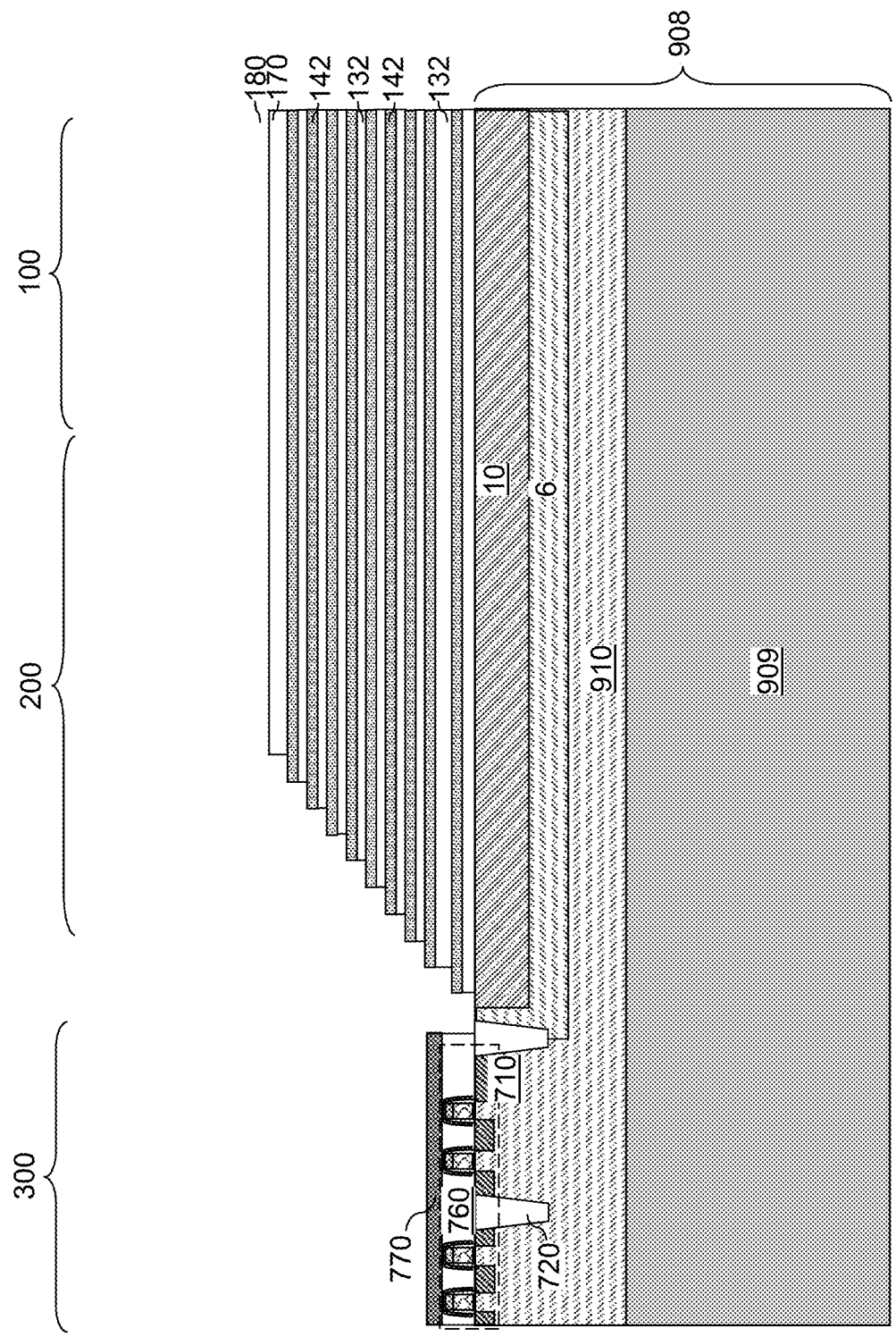
FIG. 2 is a vertical cross-sectional view of a region of the exemplary structure after formation of a first-tier alternating stack of first insulating layers and first spacer material layers and after patterning a first-tier staircase region according to an embodiment of the present disclosure.

Referring to FIG. 2, the etch stop dielectric layer 770 and the planarization dielectric layer 760 can be removed from each memory array region 100 and from each staircase region 200. For example, a photoresist layer (not shown) can cover each area including the semiconductor devices 710, and portions of the etch stop dielectric layer 770 and the planarization dielectric layer 760 that are not covered by the photoresist layer can be removed by at least one etch process, which may include an isotropic etch process (such as a wet etch process) and/or an anisotropic etch process (such as a reactive ion etch process). A top surface of the substrate 908 (such as a top surface of a second doped well 10) can be physically exposed within a memory array region 100 and adjacent staircase regions 200. The etch stop dielectric layer 770 and the planarization dielectric layer 760 can remain in the peripheral device region 300.

An alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the substrate 908.

As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

The first insulating cap layer 170 and the first-tier alternating stack (132, 142) may be patterned to form first stepped surfaces in the staircase region 200. Each layer of the first-tier alternating stack (132, 142) can be removed from above the etch stop dielectric layer 770. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

The first insulating layers 132 and the first sacrificial material layers 142 continuously extend over an entire area of a memory array region 100, and thus, are also referred to as first continuous insulating layers and first continuous sacrificial material layers, respectively. A vertically alternating sequence of the first continuous insulating layers and the first continuous sacrificial material layers can be formed over the substrate 908. The first stepped surfaces are formed at peripheral portions of the vertically alternating sequence. Each layer of the vertically alternating sequence is present within the memory array region 100. The lateral extent of the first continuous sacrificial material layers decreases with a vertical distance from the substrate 908 in each staircase region 200. In one embodiment, all layers of the vertically alternating sequence are removed from above the etch stop dielectric layer 770, and the stepped surfaces of the remaining portions of the vertically alternating sequence do not extend to areas in which the etch stop dielectric layer 770 is present.

Figure 3:
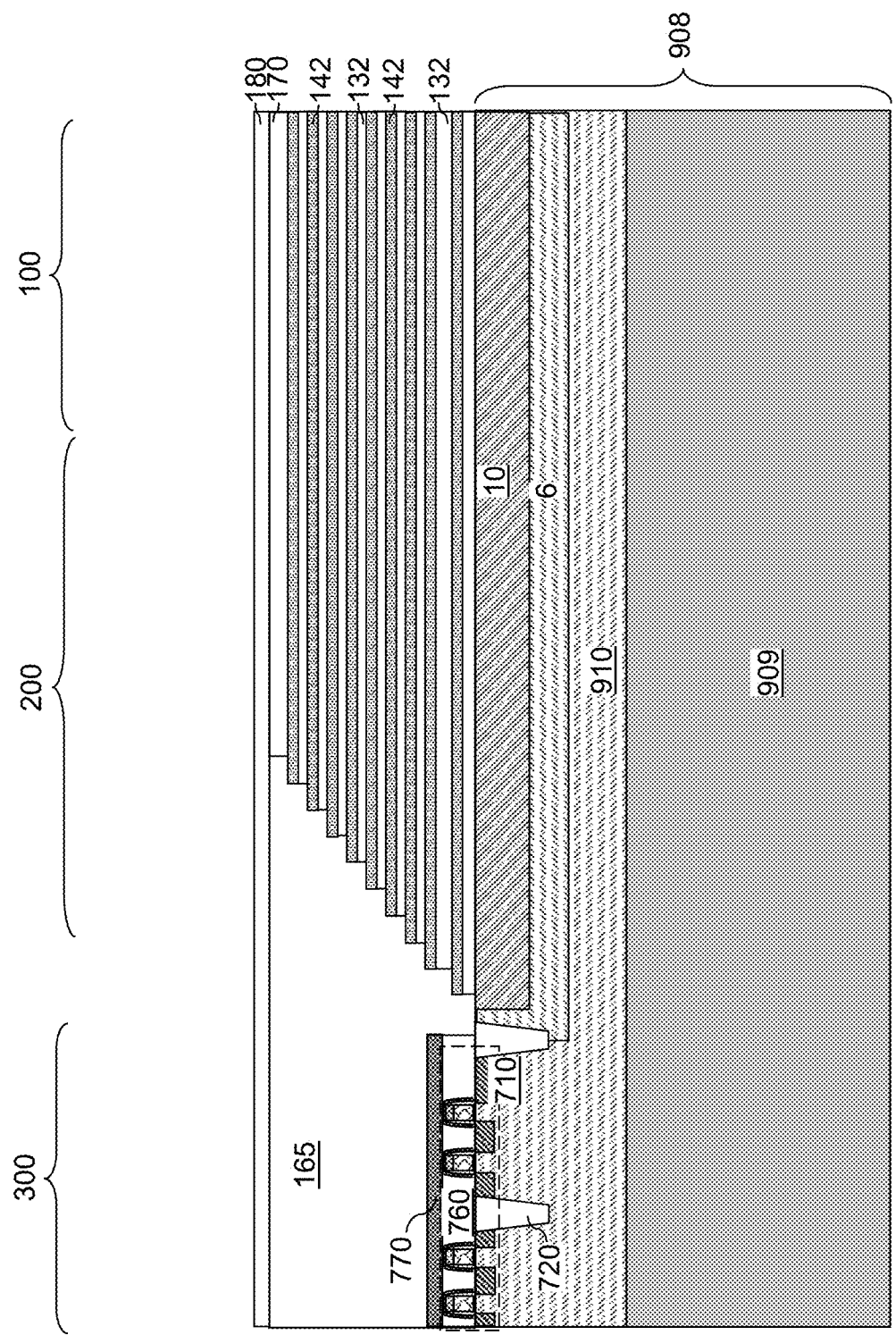
FIG. 3 is a vertical cross-sectional view of a region of the exemplary structure after formation of a first retro-stepped dielectric material portion and a first inter-tier dielectric layer according to an embodiment of the present disclosure.

Referring to FIG. 3, a dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first retro-stepped dielectric material portion overlies, and contacts, the etch stop dielectric layer 770. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
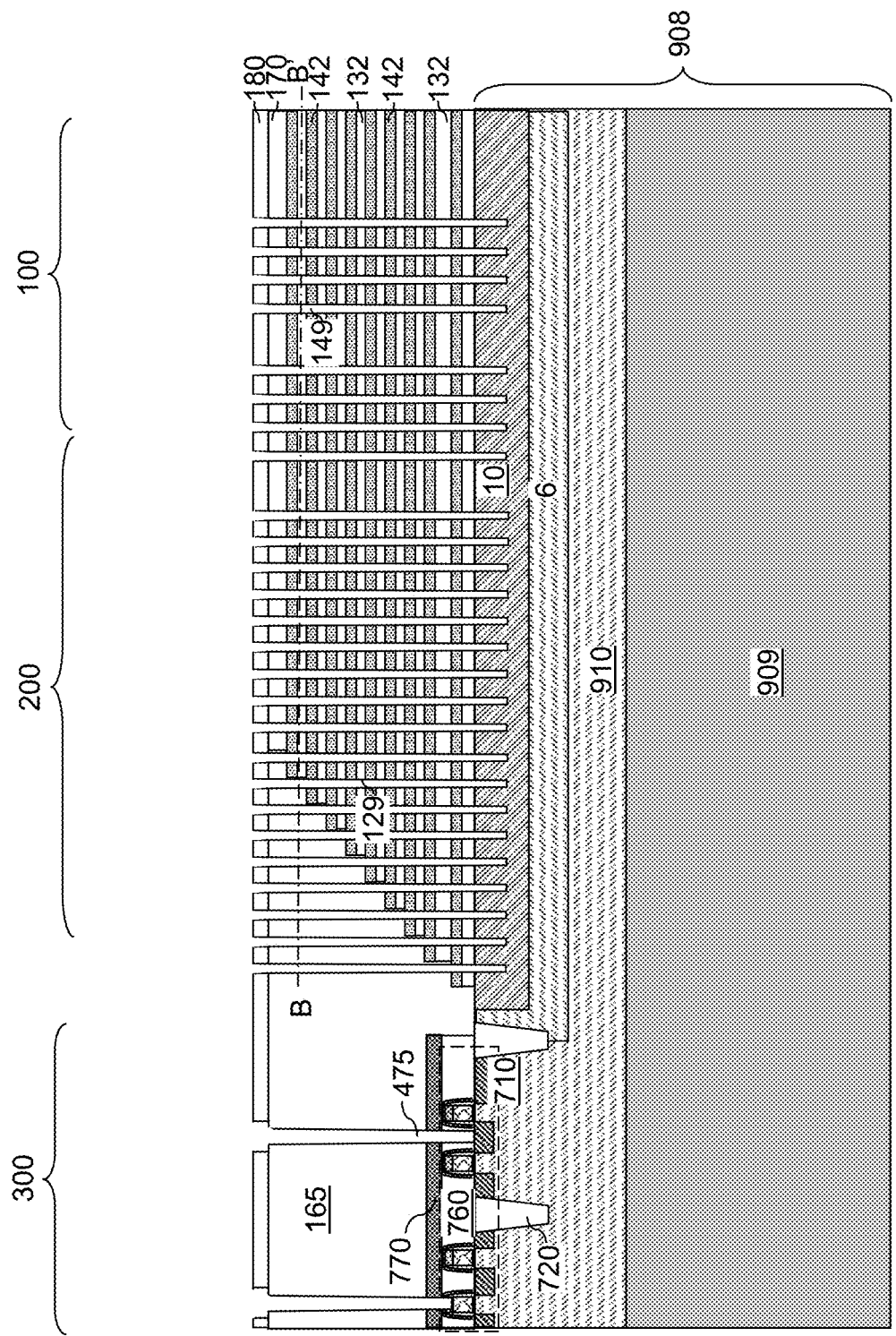
FIG. 4A is a vertical cross-sectional view of a region of the exemplary structure after formation of first-tier memory openings and first-tier support openings according to an embodiment of the present disclosure.
Figure 4B:
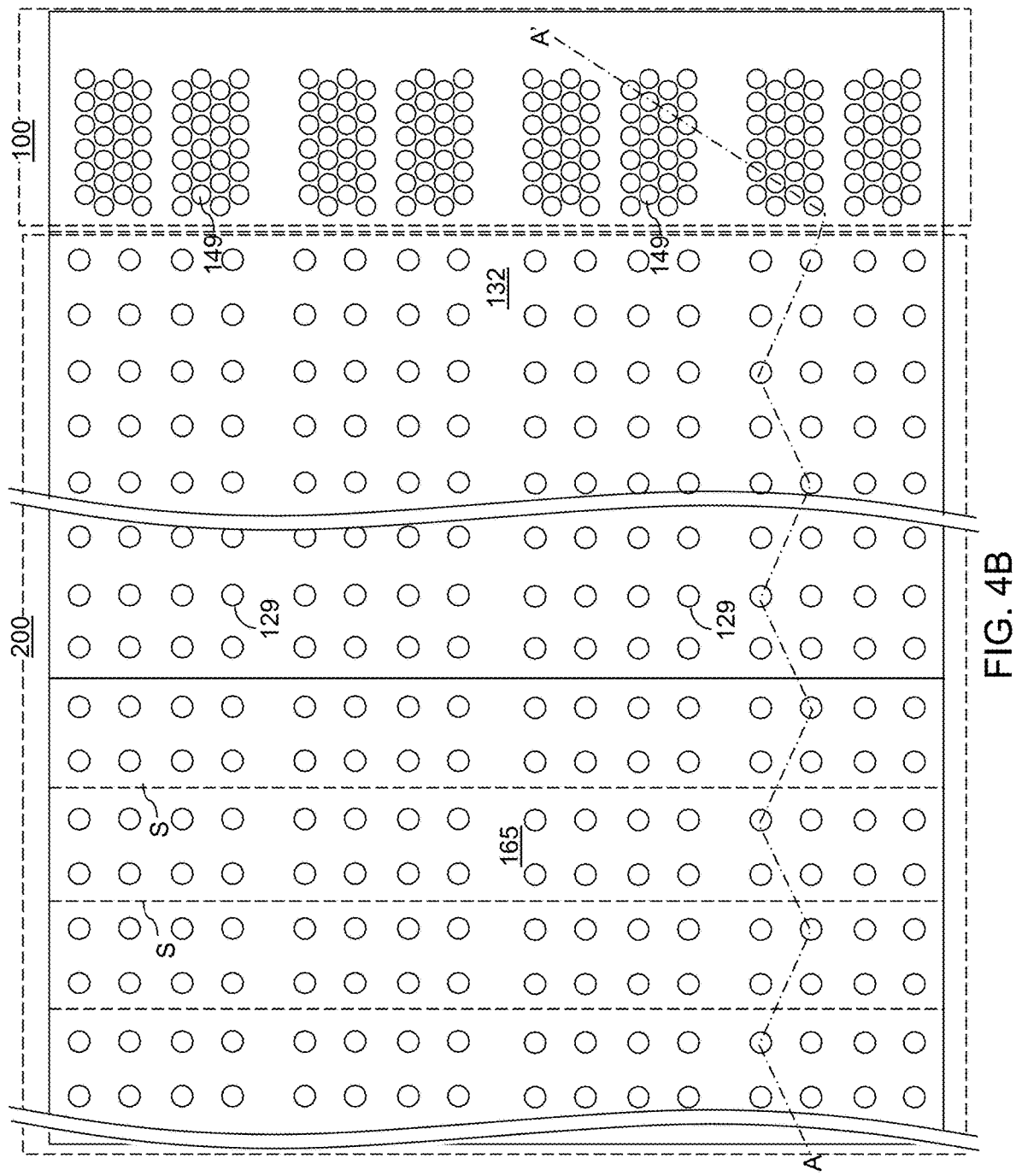
FIG. 4B is a horizontal cross-sectional view of a region of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the substrate 908 in the memory array regions 100 and in the staircase regions 200. Various sacrificial contact via cavities 475 can be formed through the inter-tier dielectric layer 180, the first retro-stepped dielectric material portion 165, the etch stop dielectric layer 770, and the planarization dielectric layer 760 onto a surface of a respective component among the semiconductor devices 710.

For example, a photoresist layer (not shown) may be applied over the inter-tier dielectric layer 180, and may be lithographically patterned to form various openings therethrough. The pattern of openings in the photoresist layer may be transferred through the inter-tier dielectric layer 180, the first-tier structure (132, 142, 170, 165), and any underlying portions of the etch stop dielectric layer 770 and the planarization dielectric layer 760 and into the substrate 908 by a first anisotropic etch process to form the various first-tier openings (149, 129) and the sacrificial contact via cavities 475 concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200. A subset of the first-tier support openings 129 that is formed through the first stepped dielectric material portion 165 may be formed through a respective horizontal surface of the first stepped surfaces.

The sacrificial via contact openings 475 are openings that are formed in the peripheral device region 300. The sacrificial via contact openings 475 are formed over a respective component of the semiconductor devices 710. For example, the sacrificial via contact openings 475 can be formed on components of field effect transistors such as gate electrodes and active regions (e.g., source regions and drain regions).

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered. Subsequently, the first anisotropic etch process can etch through the materials of the etch stop dielectric layer 770 and the planarization dielectric layer 760. In one embodiment, the terminal portion of the anisotropic etch process may include an overetch step that etches into an upper portion of the second doped well 10. The photoresist layer may be subsequently removed, for example, by ashing.

Optionally, the portions of the first-tier memory openings 149, the first-tier support openings 129, and the sacrificial via contact openings 475 may be laterally expanded at the level of the inter-tier dielectric layer 180 by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. For example, the first retro-stepped dielectric material portion 165 can include undoped silicate glass, and the inter-tier dielectric layer 180 can include borosilicate glass, borophosphosilicate glass, or organosilicate glass. An isotropic etch (such as a wet etch using HF) may be used to expand the lateral dimensions of the first-tier memory openings 149, the first-tier support openings 129, and the sacrificial via contact openings 475 at the level of the inter-tier dielectric layer 180. The maximum lateral dimension of each of the first-tier memory openings 149, the first-tier support openings 129, and the sacrificial via contact openings 475 at the level of the inter-tier dielectric layer 180 can be in a range from 110% to 300% of the maximum lateral dimension of the same opening at the level of the first insulating cap layer 170. The widening of the upper portions of the first-tier memory openings 149, the first-tier support openings 129, and the sacrificial via contact openings 475 can be advantageously employed to ensure connection of upper level openings to be subsequently formed to a respective underlying opening in a subsequent processing step.

In one embodiment, the maximum lateral dimension of each first-tier memory opening 149 and each first-tier support opening 129 within the first-tier alternating stack (132, 142) and the first insulating cap layer 170 can be in a range from 50 nm to 300 nm, although lesser and greater maximum lateral dimensions can also be employed. The maximum lateral dimension of each first-tier memory opening 149 and each first-tier support opening 129 within the inter-tier dielectric layer 180 can be in a range from 60 nm to 900 nm, although lesser and greater maximum lateral dimensions can also be employed. The maximum lateral dimension of each sacrificial contact via opening 475 within the first retro-stepped dielectric material portion 165, the etch stop dielectric layer 770, and the planarization dielectric layer 760 can be in a range from 50 nm to 600 nm, although lesser and greater maximum lateral dimensions can also be employed. The maximum lateral dimension of each sacrificial contact via opening 475 within the inter-tier dielectric layer 180 can be in a range from 60 nm to 1,200 nm, although lesser and greater maximum lateral dimensions can also be employed.

The sidewalls of the first-tier memory openings 149, the first-tier support openings 129, and the sacrificial contact via openings 475 may be vertical, or may have a taper angle with respect to the vertical direction (which is the direction that is normal to the top surface of the substrate 908). In one embodiment, the sidewalls of the first-tier memory openings 149 and the first-tier support openings 129 that extend through the first insulating cap layer 170 and the first-tier alternating stack (132, 142) can have taper angles in a range from 0.1 degree to 3 degrees. In one embodiment, the sidewalls of the sacrificial contact via openings 475 that extend through the first insulating cap layer 170, the first retro-stepped dielectric material portion 165, the etch stop dielectric layer 770, and the planarization dielectric layer 760 can have taper angles in a range from 0.1 degree to 3 degrees.

Figure 5:
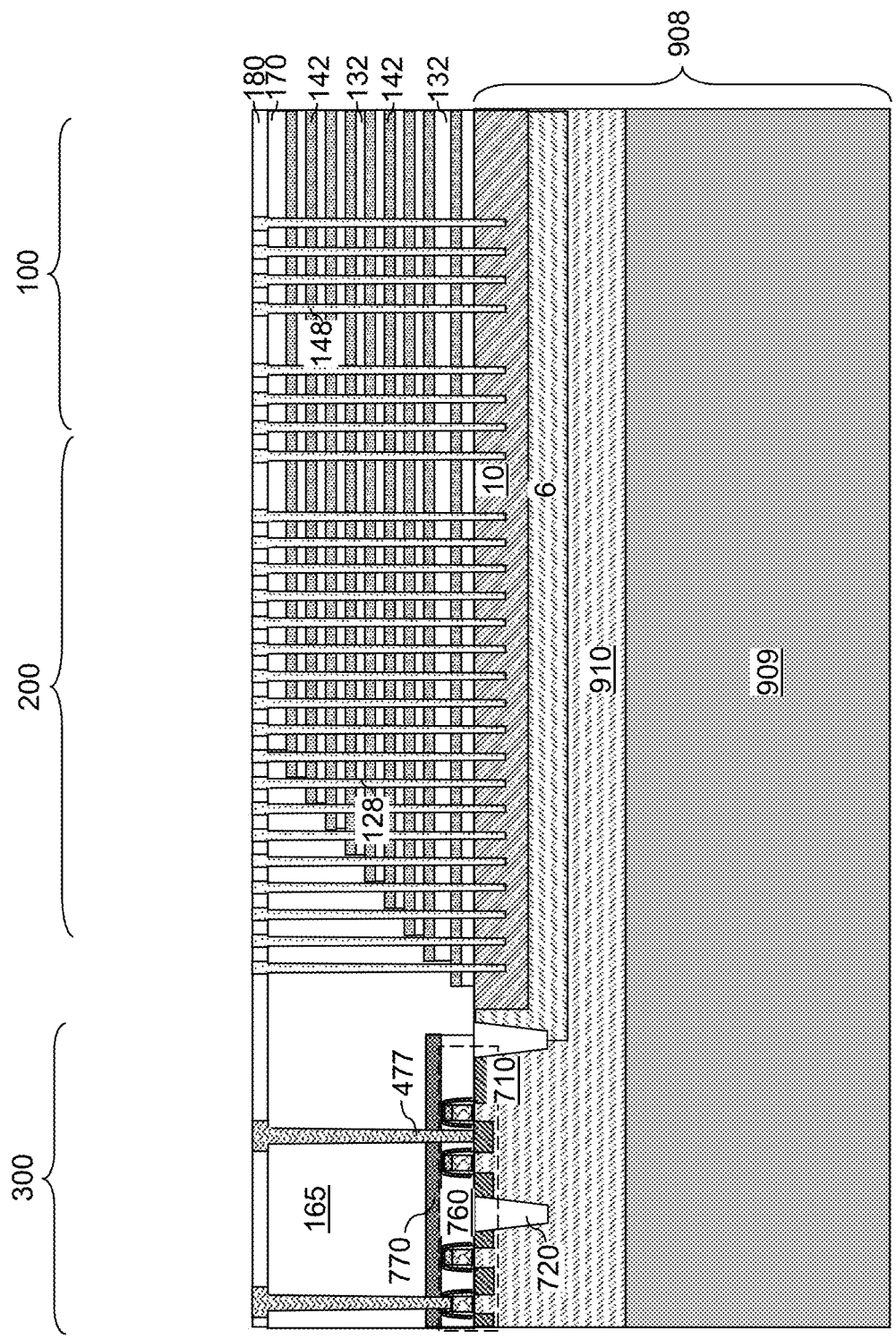
FIG. 5 is a vertical cross-sectional view of a region of the exemplary structure after formation of various sacrificial fill structures according to an embodiment of the present disclosure.

Referring to FIG. 5, a sacrificial first-tier fill material can be simultaneously deposited in each of the first-tier openings (149, 129) and sacrificial contact via openings 475. The sacrificial first-tier fill material includes a material that may be subsequently removed selective to the materials of the first insulating layers 132, the first sacrificial material layers 142, and the first retro-stepped dielectric material portion 165.

In one embodiment, the sacrificial first-tier fill material may include a semiconductor material such as silicon (e.g., amorphous silicon or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include an amorphous carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128) and sacrificial contact via structures 477. Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. Each remaining portion of the sacrificial material in a sacrificial contact via opening 475 constitutes a sacrificial contact via structure 477. The various sacrificial first-tier opening fill portions (148, 128) and the sacrificial contact via structures 477 are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180).

The top surfaces of the sacrificial first-tier opening fill portions (148, 128) and the sacrificial contact via structures 477 may be coplanar with the top surface of the inter-tier dielectric layer 180. Each of the sacrificial first-tier opening fill portions (148, 128) and the sacrificial contact via structures 477 may, or may not, include cavities therein. Each sacrificial contact via structure 477 may extend through the inter-tier dielectric layer 180, the first retro-stepped dielectric material portion 165, the etch stop dielectric layer 770, and the planarization dielectric layer 760, and may contact a component of the semiconductor devices 710 (such as the field effect transistors). Each sacrificial contact via structure 477 can have a top surface located within a horizontal plane including a top surface of the inter-tier dielectric layer 180.

Figure 6:
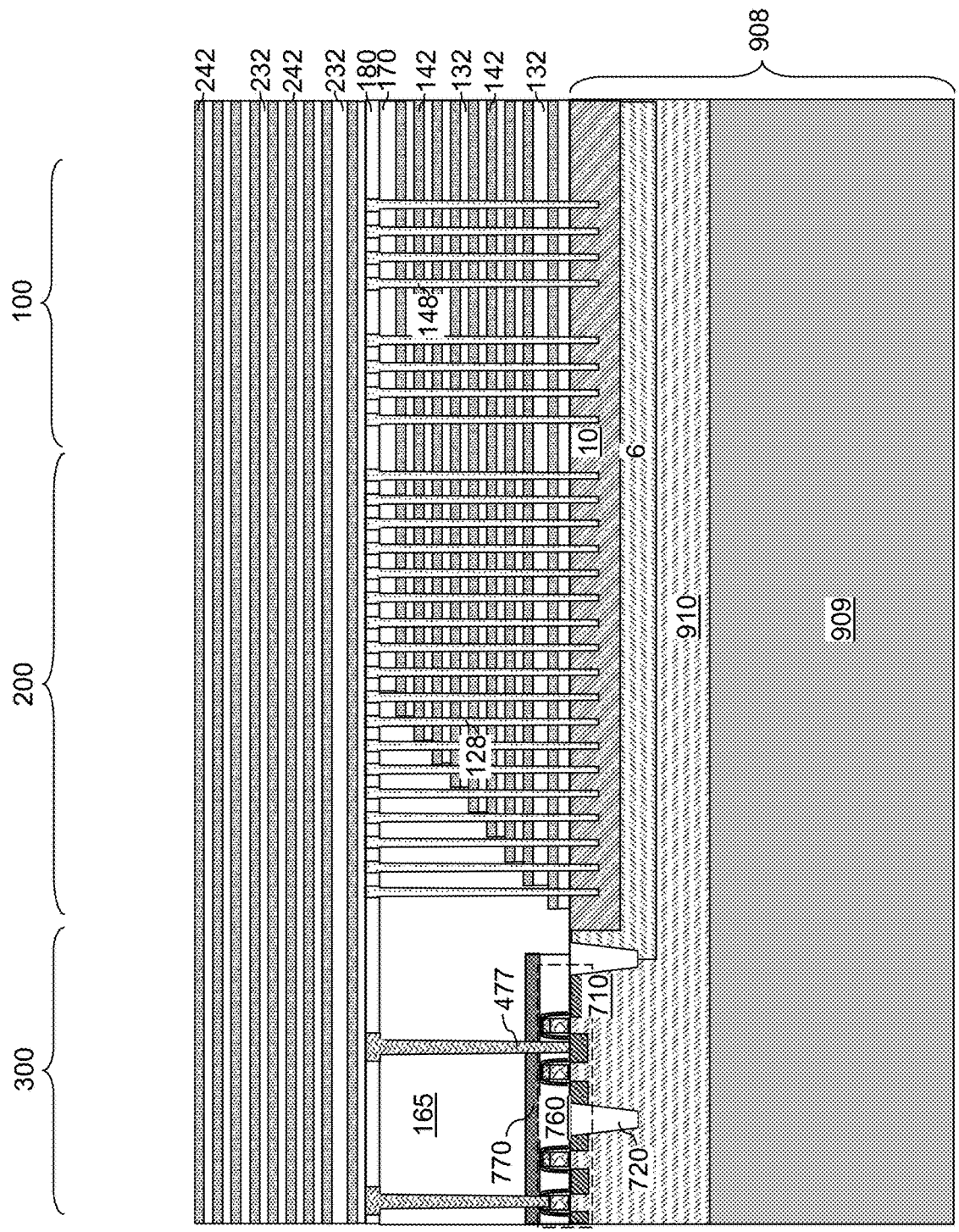
FIG. 6 is a vertical cross-sectional view of a region of the exemplary structure after formation of a second-tier alternating stack of second insulating layers and second spacer material layers according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Generally, a second-tier alternating stack of second insulating layers 232 and second spacer material layers 242 can be formed over the first-tier alternating stack (132, 142). The second spacer material layers can be formed as, or are subsequently replaced with, second electrically conductive layers.

Figure 7:
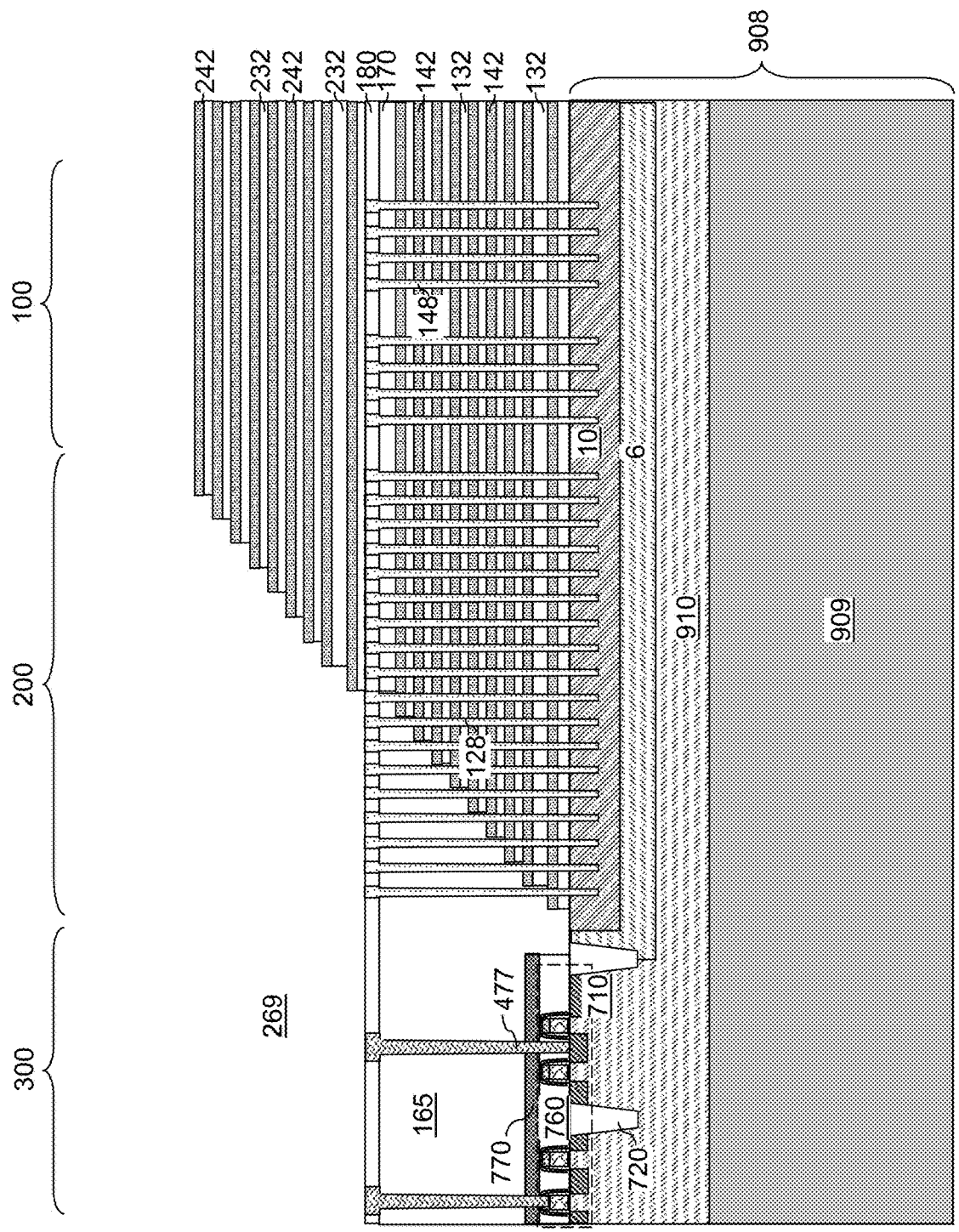
FIG. 7 is a vertical cross-sectional view of a region of the exemplary structure after formation of second stepped surfaces according to an embodiment of the present disclosure.

Referring to FIG. 7, second stepped surfaces may be formed in the second stepped area in the staircase region 200 using a same set of processing steps as the processing steps used to form the first stepped surfaces in the first stepped area with suitable adjustment to the pattern of at least one masking layer. In one embodiment, the area of the second stepped surfaces in a staircase region 200 can be laterally offset from the area of the first stepped surfaces of the first-tier alternating stack (132, 242) toward the memory array region 100 to which the staircase region 200 is adjoined. A second stepped cavity 269 can be formed over the second stepped surfaces. The second stepped cavity 269 can laterally extend over the peripheral device region 300.

Figure 8:
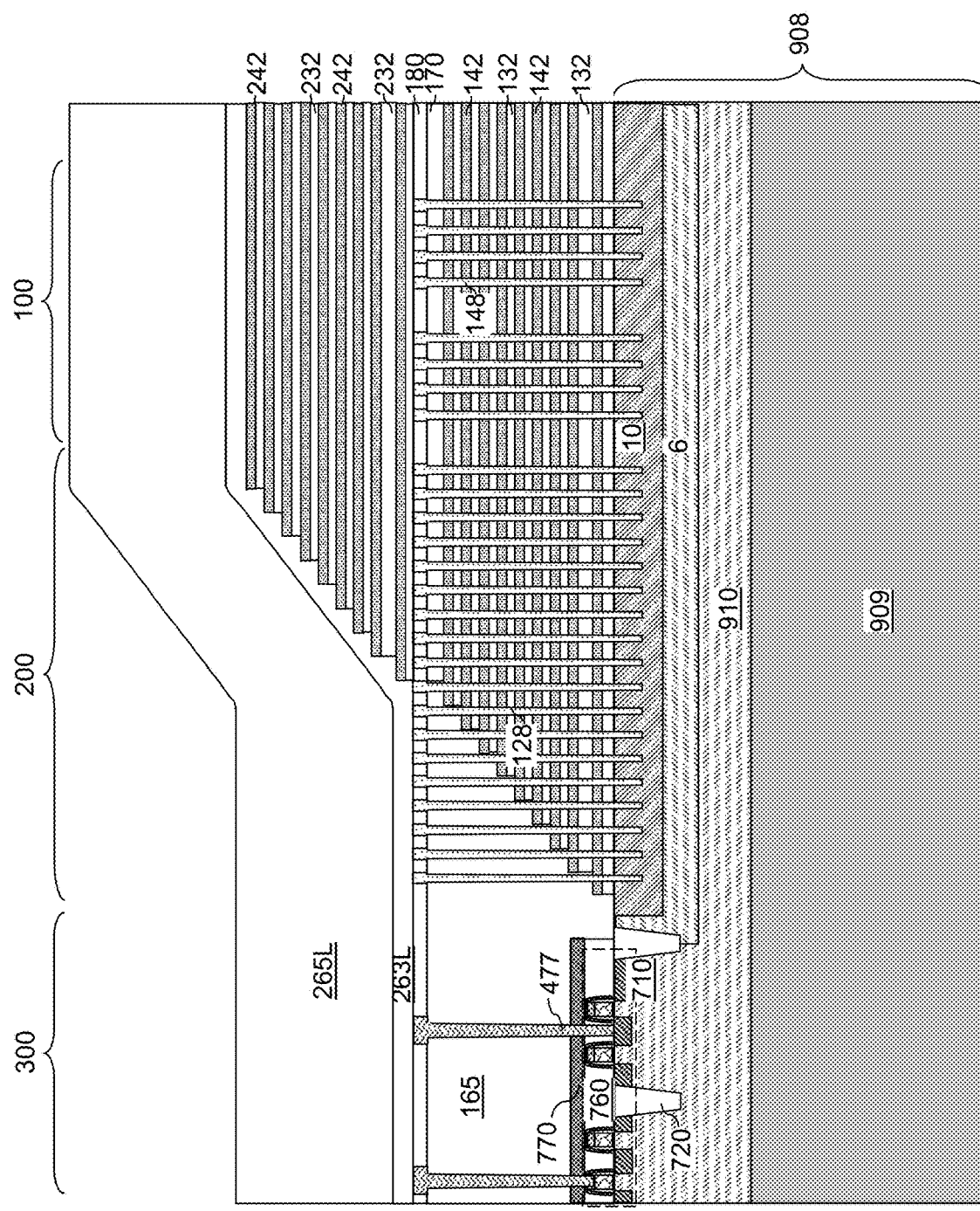
FIG. 8 is a vertical cross-sectional view of a region of the exemplary structure after formation of a doped silicate glass liner and a silicate glass material layer according to an embodiment of the present disclosure.

Referring to FIG. 8, a doped silicate glass (i.e., doped silicon oxide) liner layer 263L can be deposited over the second stepped surface of the second-tier alternating stack (232, 242) in the staircase region 200, over the physically exposed surfaces of the inter-tier dielectric layer 180, the sacrificial first-tier support opening fill portions 128, and the sacrificial contact via structures 477, and over the topmost layer of the second-tier alternating stack (232, 242) in the memory array region 100. The doped silicate glass liner layer 263L includes a doped silicate glass material providing an etch rate that is greater than an etch rate of an undoped silicate glass (i.e., undoped silicon oxide, such as silicon dioxide) material. For example, the doped silicate glass liner layer 263L includes a doped silicate glass material providing an etch rate in dilute hydrofluoric acid, such as in 100:1 dilute hydrofluoric acid:water etching solution that is at least two times greater than an etch rate of an undoped silicate glass (i.e., undoped silicon oxide, such as silicon dioxide) material.

For example, the doped silicate glass liner layer 263L can include boron, phosphorus and/or carbon doped silicon oxide, such as borosilicate glass, phosphosilicate glass or borophosphosilicate glass that provides an etch rate in 100:1 dilute hydrofluoric acid that is at least 3 times, such as at least 10 times and/or at least 30 times, greater than the etch rate of thermal silicon oxide (i.e., undoped silicon dioxide formed by thermal chemical vapor deposition). In one embodiment, the doped silicate glass layer 263L can include borosilicate glass in which the weight percentage of boron atoms is in a range from 1% to 6%, such as from 2% to 4%. The doped silicate glass liner layer 263L can be deposited by chemical vapor deposition. The thickness of the doped silicate glass liner layer 263L can be in a range from 100 nm to 1,000 nm, such as from 150 nm to 500 nm, although lesser and greater thicknesses can also be employed. In contrast, the inter-tier dielectric layer 180 and the first retro-stepped dielectric material portion 165 may comprise not intentionally doped thermal silicon oxide, such as densified silicon oxide formed by CVD using thermal decomposition of tetraethylorthosilicate (TEOS) as a precursor material. This silicon oxide may be unintentionally doped with a small amount of carbon and/or hydrogen from the TEOS precursor material.

A silicate glass material layer 265L can be subsequently deposited over the doped silicate glass liner layer 263L. The silicate glass material layer 265L can include a silicate glass material having a lower etch rate than the material of the doped silicate glass liner layer 263L, such as a lower etch rate in 100:1 dilute hydrofluoric acid. For example, the silicate glass material layer 265L can include undoped (i.e., not intentionally doped) silicate glass formed by thermal decomposition of tetraethylorthosilicate (TEOS) as a precursor material that lacks boron or phosphorus or which contains less than one weight percent boron or phosphorus. The thickness of the silicate glass material layer 265L can be selected such that the sum of the thickness of the doped silicate glass liner layer 263L and the thickness of the silicate glass material layer 265L is greater than the thickness of the second-tier alternating stack (232, 242).

In one embodiment, the materials of the inter-tier dielectric layer 180, the doped silicate glass liner 263L, and the silicate glass material layer 265L can be selected such that the etch rate of the material of the doped silicate glass liner layer 263L in a 100:1 dilute hydrofluoric acid at room temperature is significantly greater, such as at least two times greater than the etch rate of the material of the silicate glass material layer 265L and of the material of the inter-tier dielectric layer 180. For example, the doped silicate glass liner layer 263L can include borosilicate glass, and the silicate glass material layer 265L and the inter-tier dielectric layer 180 and can include undoped silicate glass. In one embodiment, the ratio of the etch rate of the material of the doped silicate glass liner layer 263L in a 100:1 dilute hydrofluoric acid at room temperature to the etch rate of the material of the silicate glass material layer 265L and the inter-tier dielectric layer 180 and can be in a range from 3 to 10,000, such as 10 to 1,000.

Figure 9:
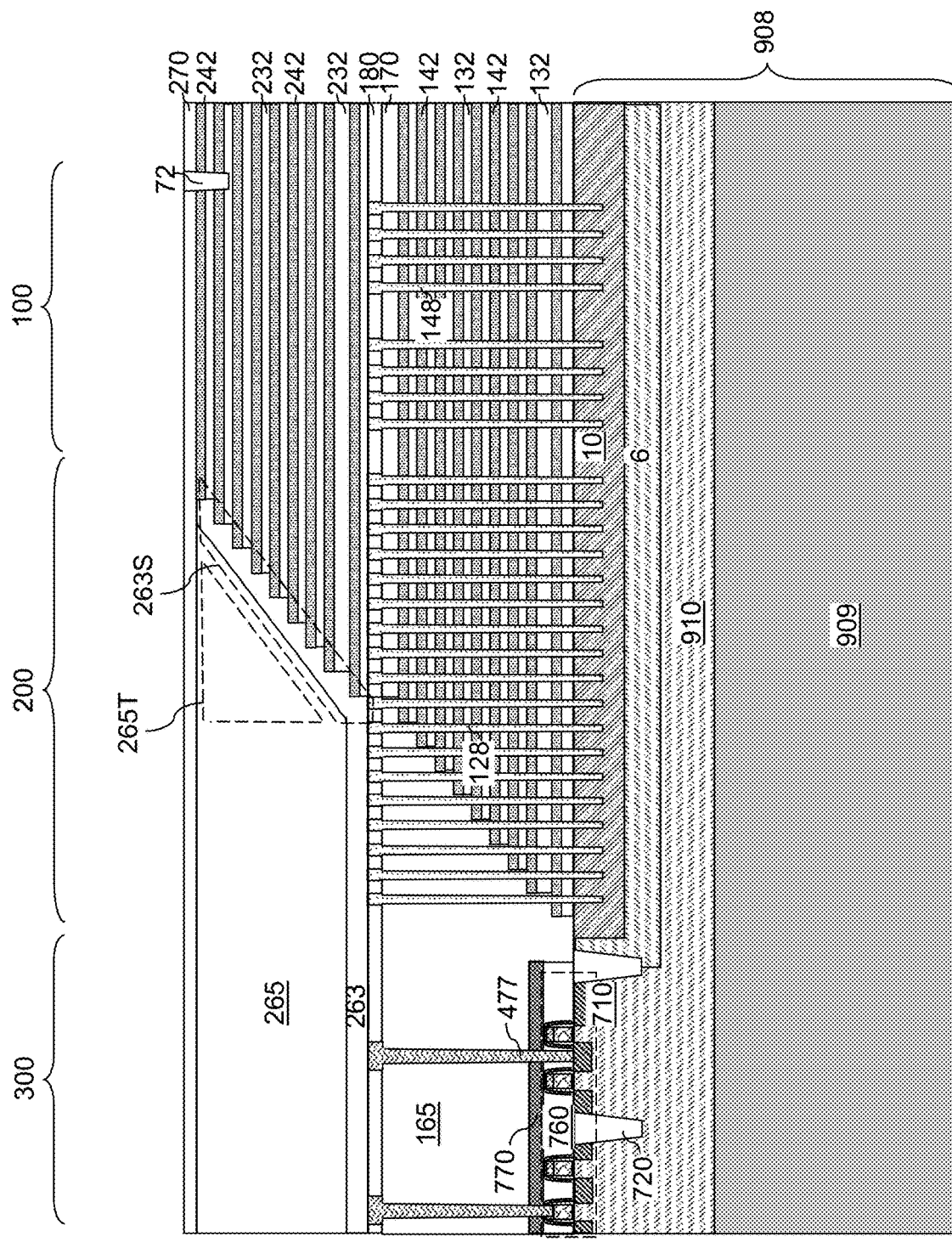
FIG. 9 is a vertical cross-sectional view of a region of the exemplary structure after formation of a second retro-stepped dielectric material portion, a second insulating cap layer, and drain-select-level dielectric isolation structures according to an embodiment of the present disclosure.

Referring to FIG. 9, the silicate glass material layer 265L and the doped silicate glass liner layer 263L can be planarized to remove portions of the silicate glass material layer 265L and the doped silicate glass liner layer 263L that overlie a horizontal plane including a top surface of the topmost layer of the second-tier alternating stack (232, 242). In one embodiment, chemical mechanical planarization (i.e., chemical mechanical polishing) (CMP) is used for planarization. In an alternative embodiment, a self-planarizing etch mask material such as polyimide can be applied over the silicate glass material layer 265L such that the self-planarizing etch mask material covers the silicate glass material layer 265L in the staircase regions 200 and the peripheral device region 300 without covering the portions of the silicate glass material layer 265L and the doped silicate glass liner layer 263L in the memory array regions 100. An etch process can be performed to recess unmasked portions of the silicate glass material layer 265L and the silicate glass material layer 265L in the memory array regions 100. The self-planarizing etch mask material can be removed, for example, by ashing. A chemical mechanical planarization process can be performed to remove portions of the silicate glass material layer 265L and the doped silicate glass liner layer 263L that overlie the horizontal plane including the top surface of the topmost layer of the second-tier alternating stack (232, 242).

Remaining portions of the silicate glass material layer 265L and the doped silicate glass liner layer 263L constitutes a second retro-stepped dielectric material portion (263, 265) located over the second stepped surfaces. The second retro-stepped dielectric material portion (263, 265) comprises a doped silicate glass liner 263 and an undoped silicate glass material portion 265 that overlie the doped silicate glass liner 263. The doped silicate glass liner 263 is a remaining portion of the doped silicate glass liner layer 263L after the planarization process, and the undoped silicate glass material portion 265 is a remaining portion of the silicate glass material layer 265L after the planarization process. The top surface of the doped silicate glass liner 263 and the top surface of the silicate glass material portion 265 can be located within a horizontal plane including the top surface of the topmost layer of the second-tier alternating stack (232, 242).

The doped silicate glass liner 263 includes a sloping portion 263S that contacts the stepped surfaces of the second-tier alternating stack (232, 242). As used herein, a "sloping portion" refers to a portion that generally extends laterally at an angle greater than zero and less than ninety degrees relative to a horizontal plane. The silicate glass material portion 265 overlies the doped silicate glass liner 263, and includes a tapered portion 265T having a vertical thickness that monotonically increases with a distance from a boundary between a memory array region 100 and the staircase region 200 in which the tapered portion is located. The second retro-stepped dielectric material portion (263, 265) is formed over the second stepped surfaces in the staircase region 200.

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers (i.e., gate electrodes of drain select transistors) are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride. The second alternating stack (232, 242), the second stepped dielectric material portion (263, 265), the second insulating cap layer 270, and the optional drain-select-level isolation structures 72 collectively constitute a second-tier structure (232, 242, 263, 265, 270, 72).

Figure 10A:
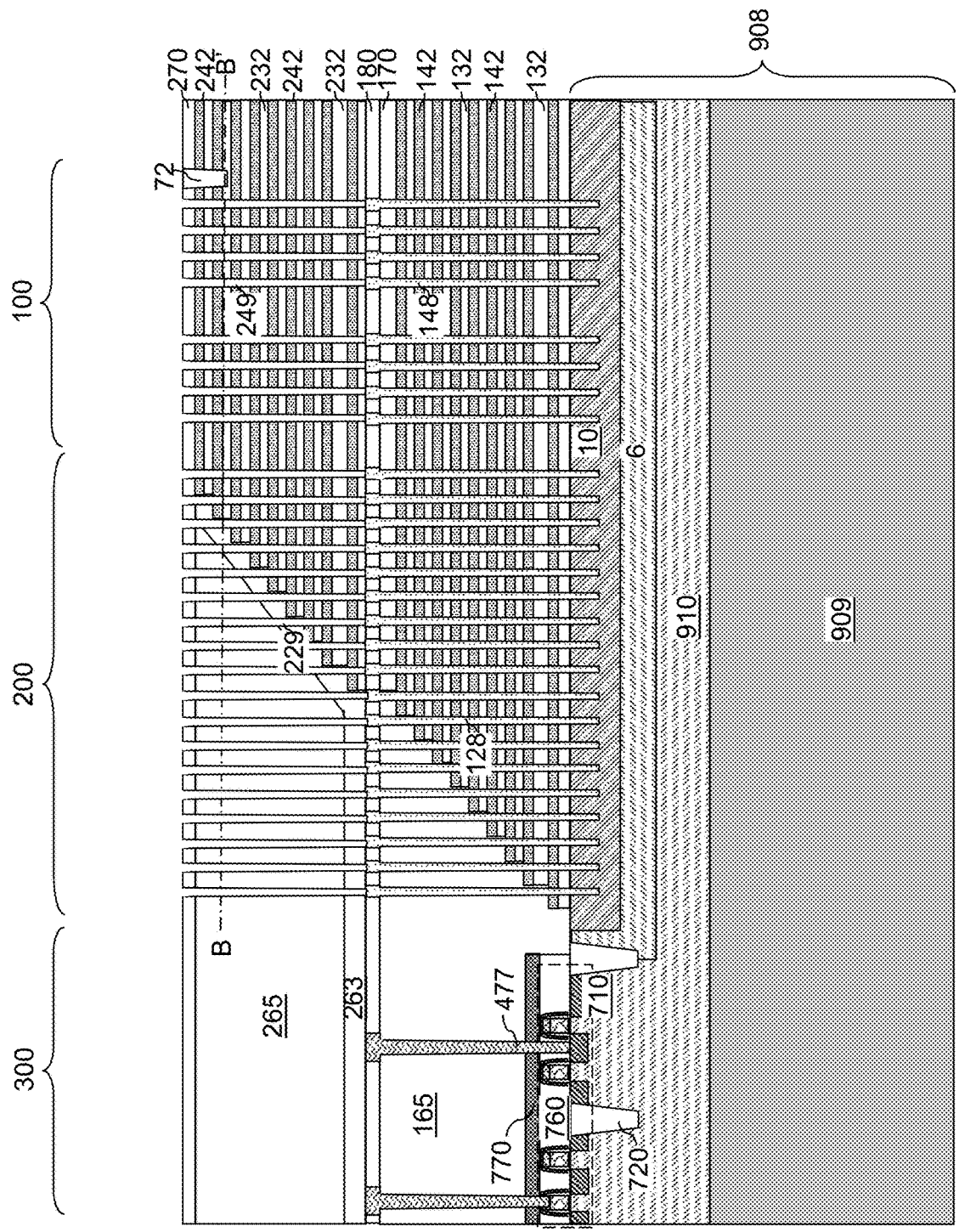
FIG. 10A is a vertical cross-sectional view of a region of the exemplary structure after formation of second-tier memory openings and second-tier support openings according to an embodiment of the present disclosure.
Figure 10B:
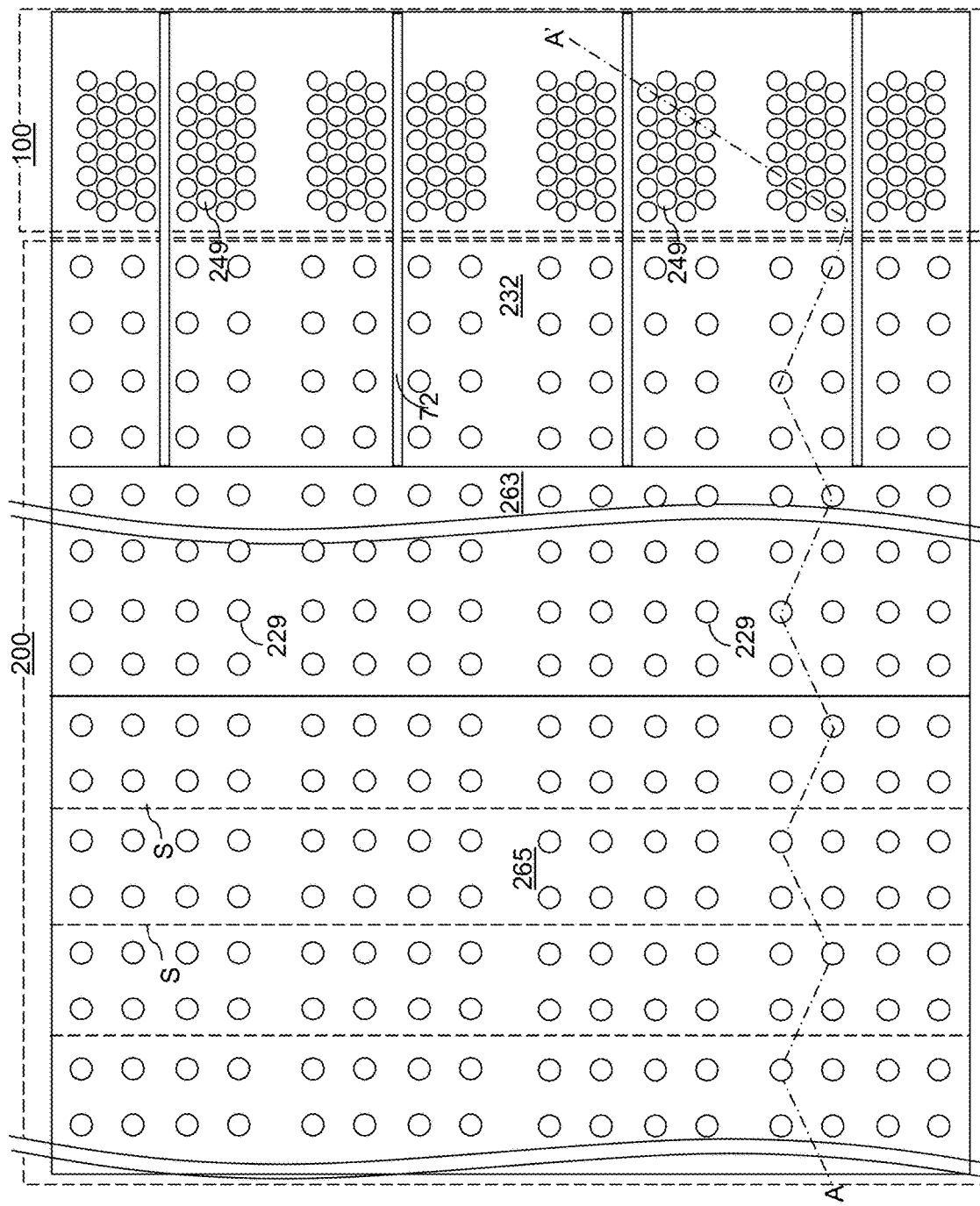
FIG. 10B is a horizontal cross-sectional of a region of the exemplary structure along the horizontal plane B-B' of FIG. 10A. The hinged vertical plane A-A' corresponds to the plane of the vertical cross-sectional view of FIG. 10A.

Referring to FIGS. 10A and 10B, various second-tier openings (249, 229) may be formed through the second-tier structure (232, 242, 263, 265, 270, 72). A photoresist layer (not shown) may be applied over the second insulating cap layer 270, and may be lithographically patterned to form various openings therethrough. The pattern of the second-tier memory openings 249 in the memory array region 100 may be the same as the pattern of the first-tier memory openings 149, which is the same as the pattern of the first-tier memory opening fill portion 148. The lateral extent of the pattern of the second-tier support openings 229 in the staircase region 200 can be limited within the areas of the stepped surfaces of the second-tier alternating stack (232, 242). In other words, the second-tier support openings 229 may be absent within an area in which the second retro-stepped dielectric material portion (263, 265) contacts a top surface of the inter-stack dielectric layer 180. Thus, the lithographic mask used to pattern the first-tier openings (149, 129) may be used to pattern the photoresist layer.

The pattern of openings in the photoresist layer may be transferred through the second-tier structure (232, 242, 263, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion (263, 265). Locations of steps S in the first-tier alternating stack (132, 142) and the second-tier alternating stack (232, 242) are illustrated as dotted lines in FIG. 10B.

The second anisotropic etch process may include an etch step in which the materials of the second-tier alternating stack (232, 242) are etched concurrently with the material of the second stepped dielectric material portion (263, 265). The chemistry of the etch step may alternate to optimize etching of the materials in the second-tier alternating stack (232, 242) while providing a comparable average etch rate to the material of the second stepped dielectric material portion (263, 265). The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 11:
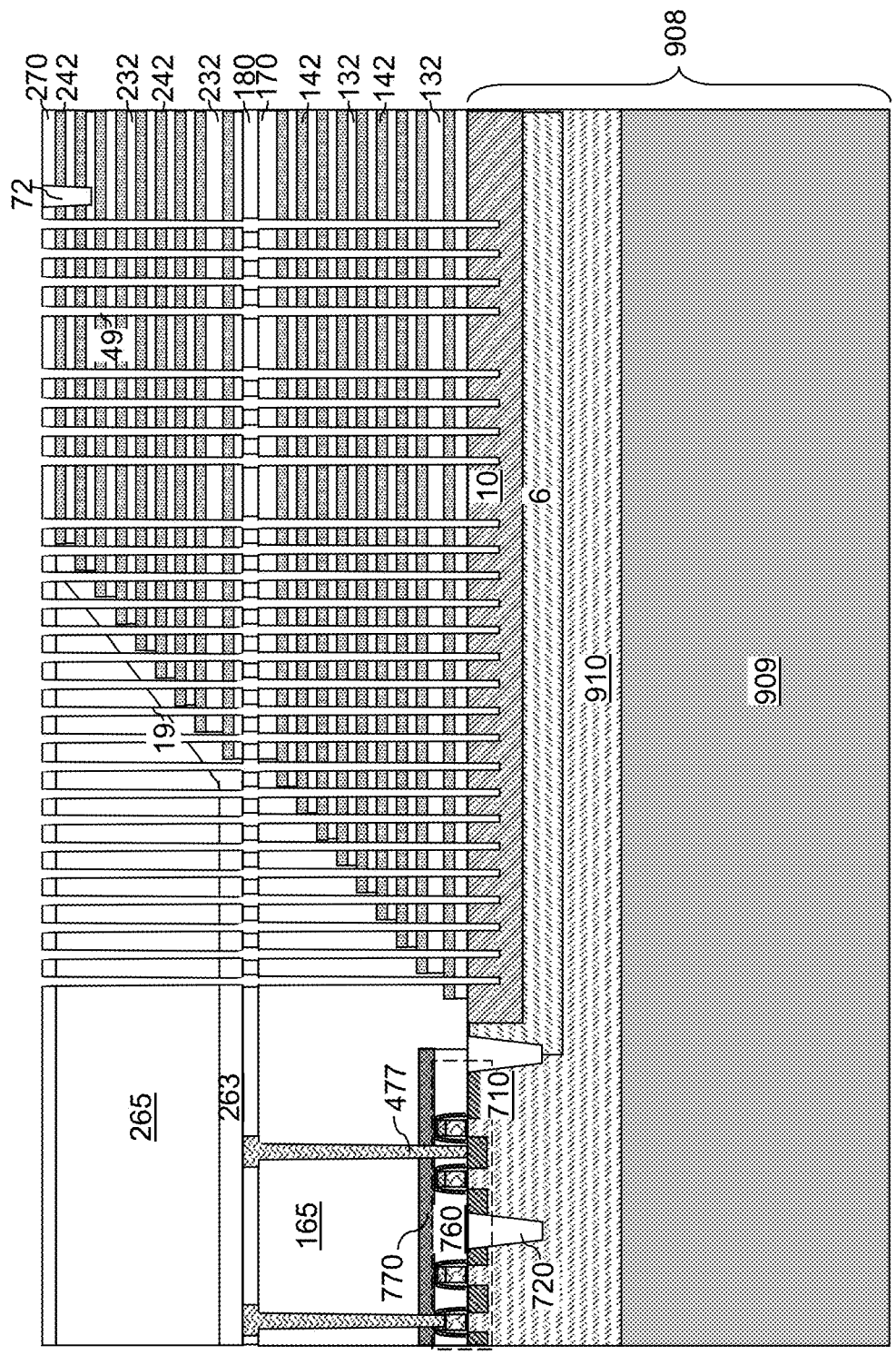
FIG. 11 is a vertical cross-sectional view of a region of the exemplary structure after formation of inter-tier memory openings and inter-tier support openings according to an embodiment of the present disclosure.

Referring to FIG. 11, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the first inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 12A-12D provide sequential cross-sectional views of a memory opening 49 during formation of a memory opening fill structure. The same structural change occurs in each of the memory openings 49 and the support openings 19.

Referring to FIG. 12A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the source semiconductor layer 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0 \times 10^{14}/cm^3$ to $1.0 \times 10^{18}/cm^3$, although lesser and greater dopant atomic concentrations may also be used. A p-n junction may be formed at each interface between the source semiconductor layer 10 and the pedestal channel portions 11.

Referring to FIG. 12B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 12C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 12D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The source semiconductor layer 10, the first-tier structure (132, 142, 170, 165), the second-tier structure (232, 242, 270, 263, 265, 72), the first inter-tier dielectric layer 180, and the memory opening fill structures 58 collectively constitute a memory-level assembly.

Figure 13:
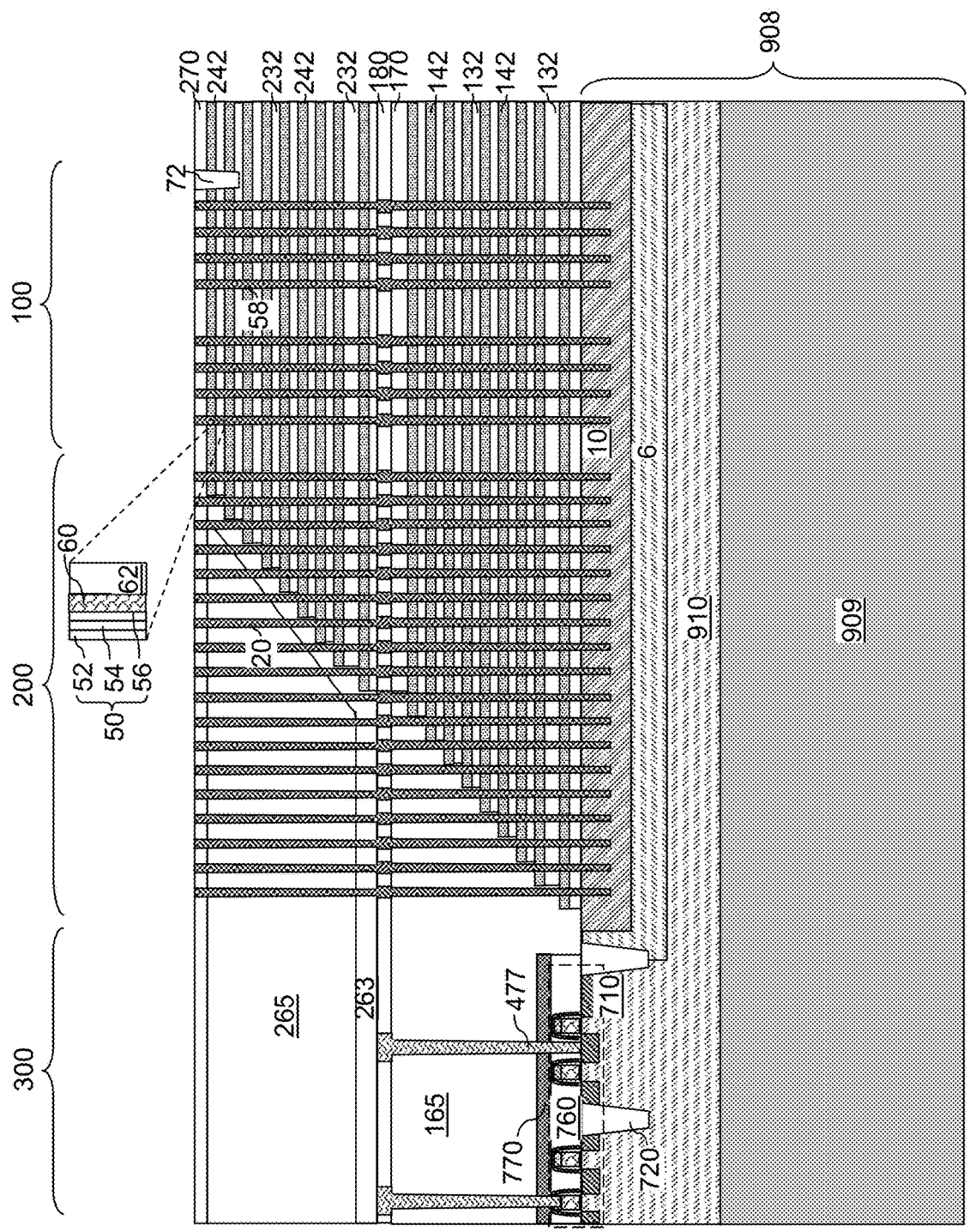
FIG. 13 is a vertical cross-sectional view of a region of the exemplary structure after formation of memory opening fill structures and support pillar structures according to an embodiment of the present disclosure.

Referring to FIG. 13, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 14A:
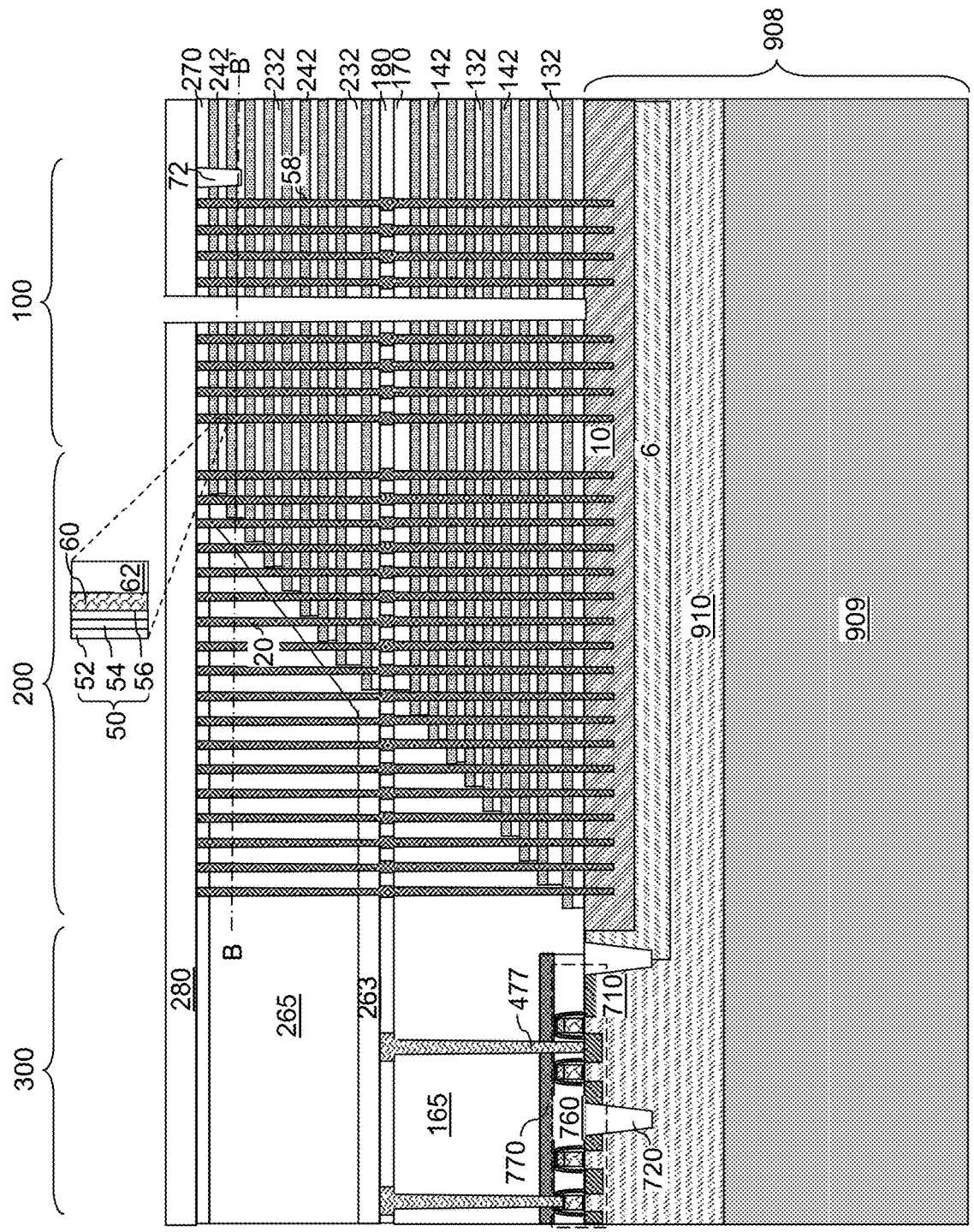
FIG. 14A is a vertical cross-sectional view of a region of the exemplary structure after formation of a contact-level dielectric layer and divider trenches according to an embodiment of the present disclosure.
Figure 14B:
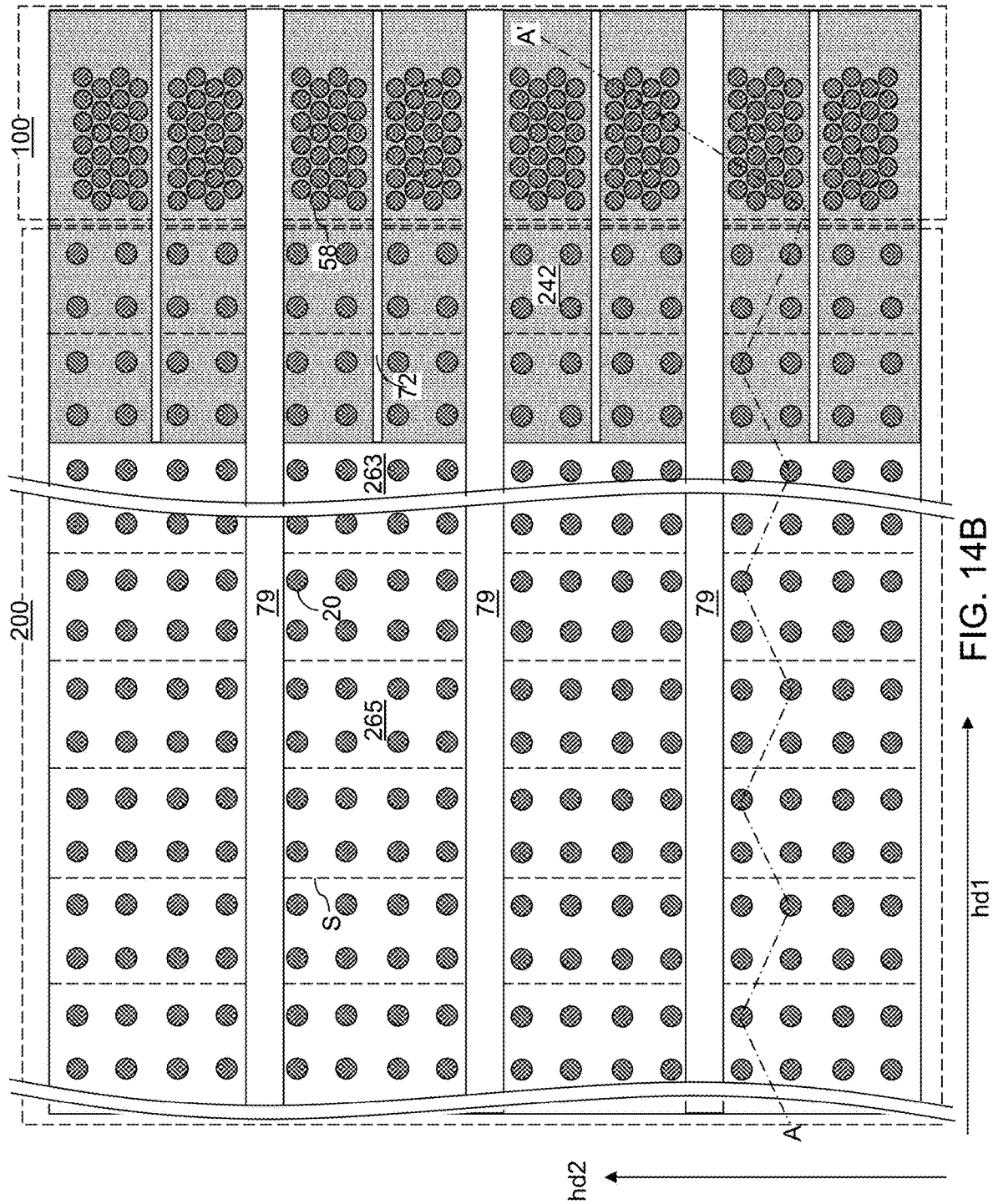
FIG. 14B is a horizontal cross-sectional of a region of the exemplary structure along the horizontal plane B-B' of FIG. 14A. The hinged vertical plane A-A' corresponds to the plane of the vertical cross-sectional view of FIG. 14A.

Referring to FIGS. 14A and 14B, a first contact-level dielectric layer 280 may be formed over the second-tier structure (232, 242, 270, 263, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the first contact-level dielectric layer 280, the second-tier structure (232, 242, 270, 263, 265, 72), and the first-tier structure (132, 142, 170, 165), and into the source semiconductor layer 10. Portions of the first contact-level dielectric layer 280, the second-tier structure (232, 242, 270, 263, 265, 72), the first-tier structure (132, 142, 170, 165), and the source semiconductor layer 10 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While it is desirable for the backside trenches 79 to be formed with completely straight sidewalls, the backside trenches 79 are often formed with local width variations with non-straight surfaces due to various effects including local variations of process parameters (such as local variations in gas flow, pressure, electrical field, etc.) and charge density variations within the exemplary structure due to local layout variations of conductive components within the exemplary structure.

Figure 15:
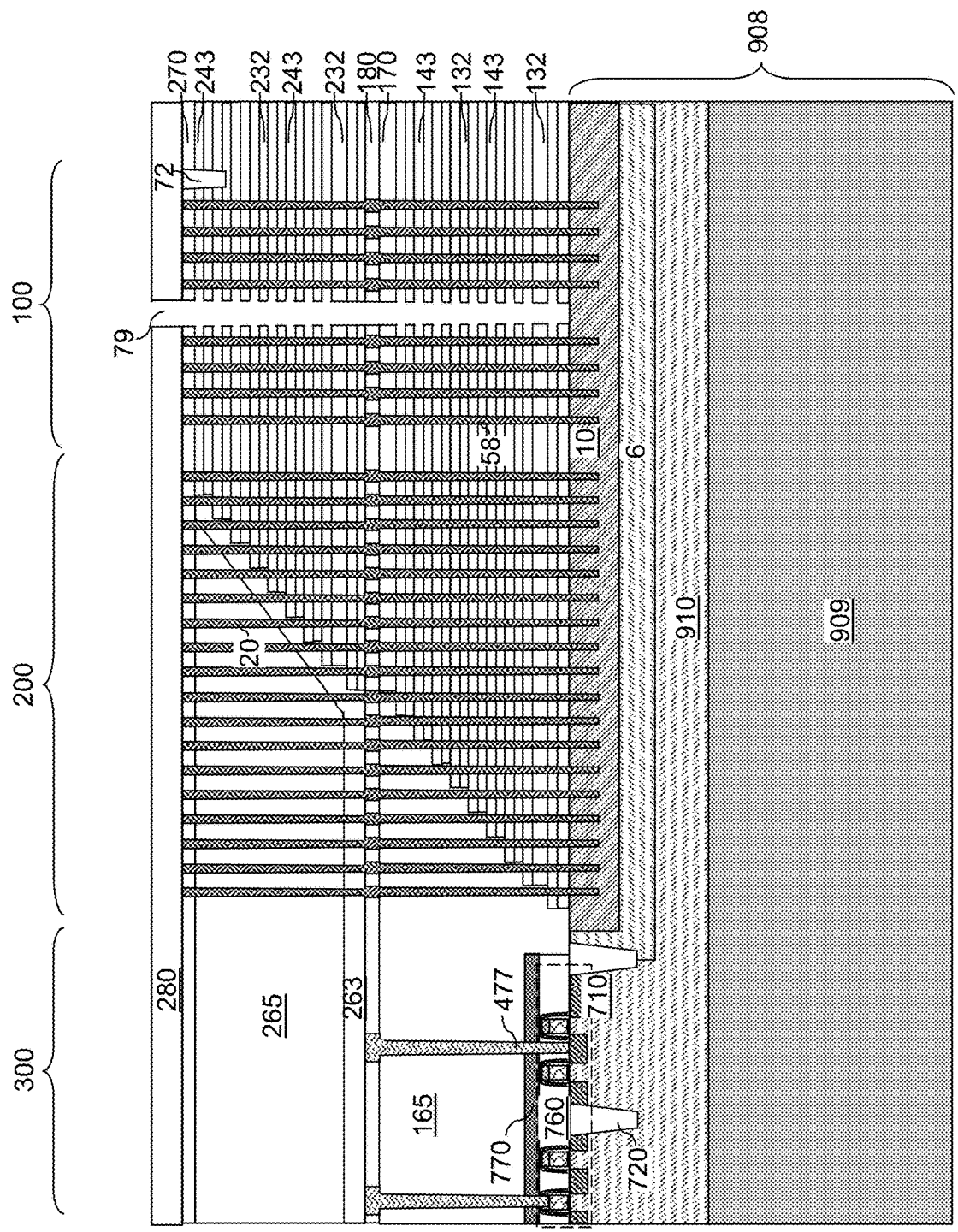
FIG. 15 is a vertical cross-sectional view of a region of the exemplary structure after formation of backside recesses according to an embodiment of the present disclosure.

Referring to FIG. 15, the sacrificial material layers (142, 242) are may be removed selective to the insulating layers (132, 232), the first and second insulating cap layers (170, 270), the first contact-level dielectric layer 280, and the source semiconductor layer 10. For example, an etchant that selectively etches the materials of the sacrificial material layers (142, 242) with respect to the materials of the insulating layers (132, 232), the first and second insulating cap layers (170, 270), the stepped dielectric material portions (165, 263, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 263, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 16A:
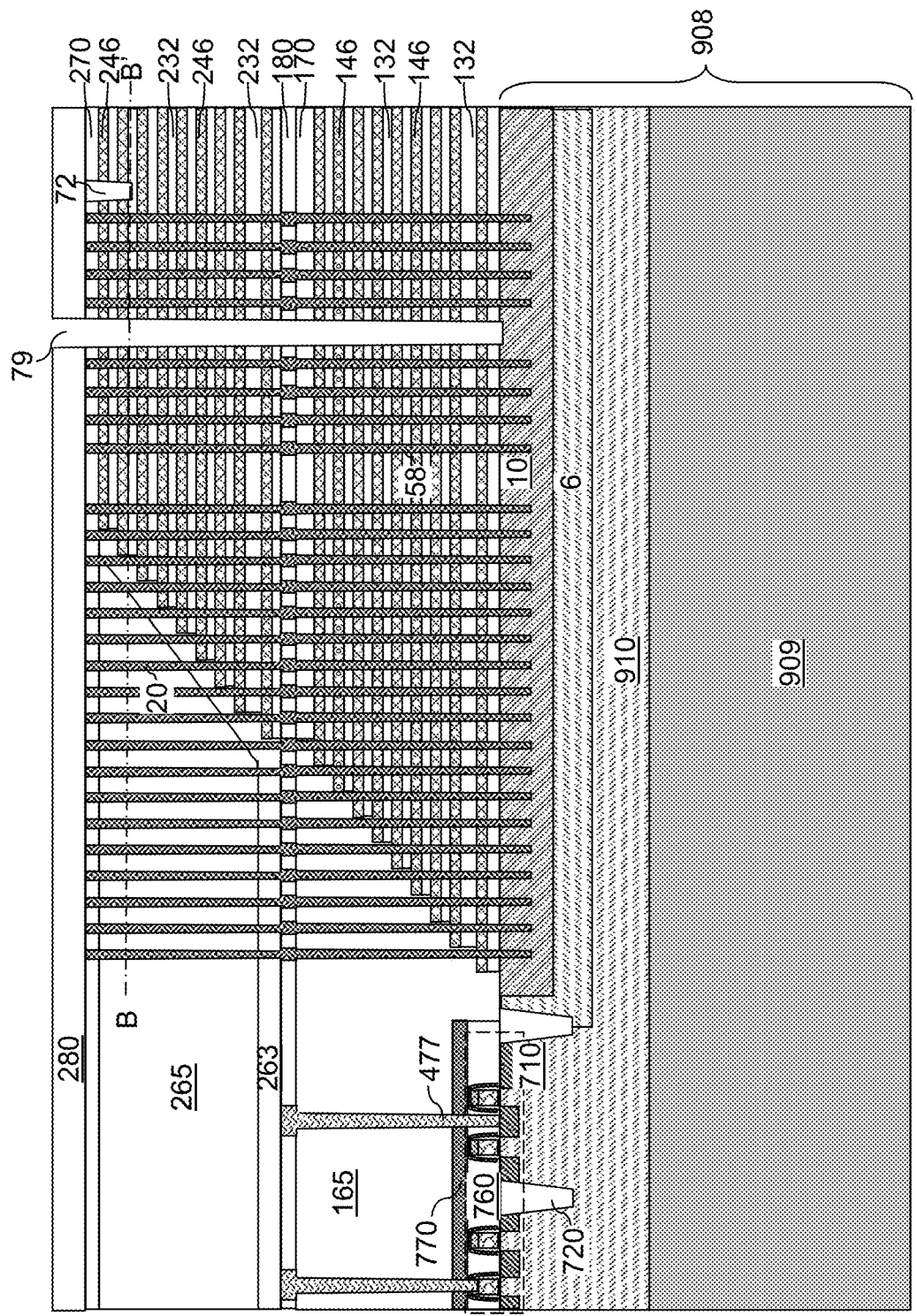
FIG. 16A is a vertical cross-sectional view of a region of the exemplary structure after formation of electrically conductive layers according to an embodiment of the present disclosure.
Figure 16B:
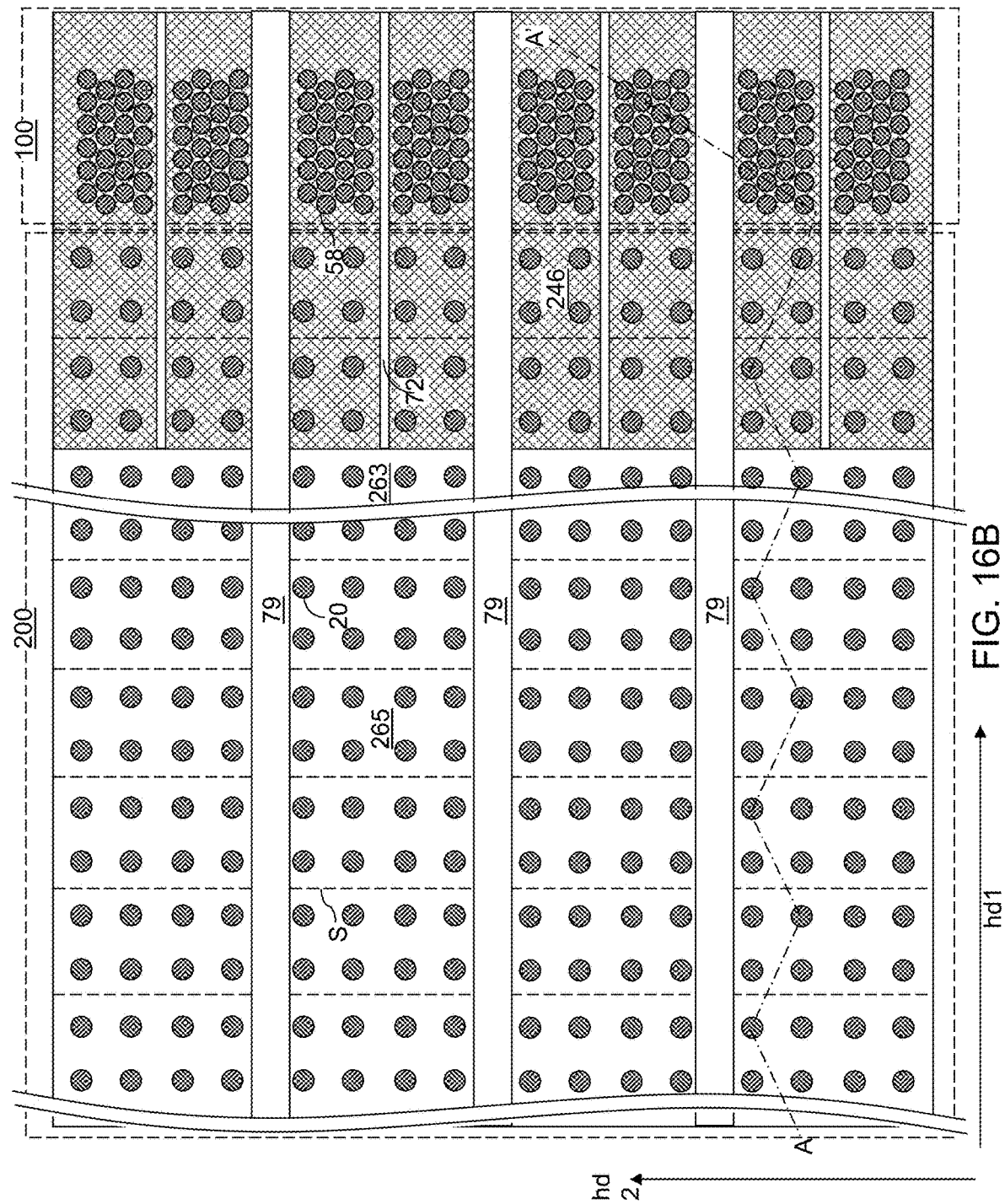
FIG. 16B is a horizontal cross-sectional of a region of the exemplary structure along the horizontal plane B-B' of FIG. 16A. The hinged vertical plane A-A' corresponds to the plane of the vertical cross-sectional view of FIG. 16A.

Referring to FIGS. 16A and 16B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The memory-level assembly is located over the substrate layer 909. The memory-level assembly includes at least one alternating stack (132, 146, 232, 246) and memory stack structures 55 vertically extending through the at least one alternating stack (132, 146, 232, 246).

Figure 17A:
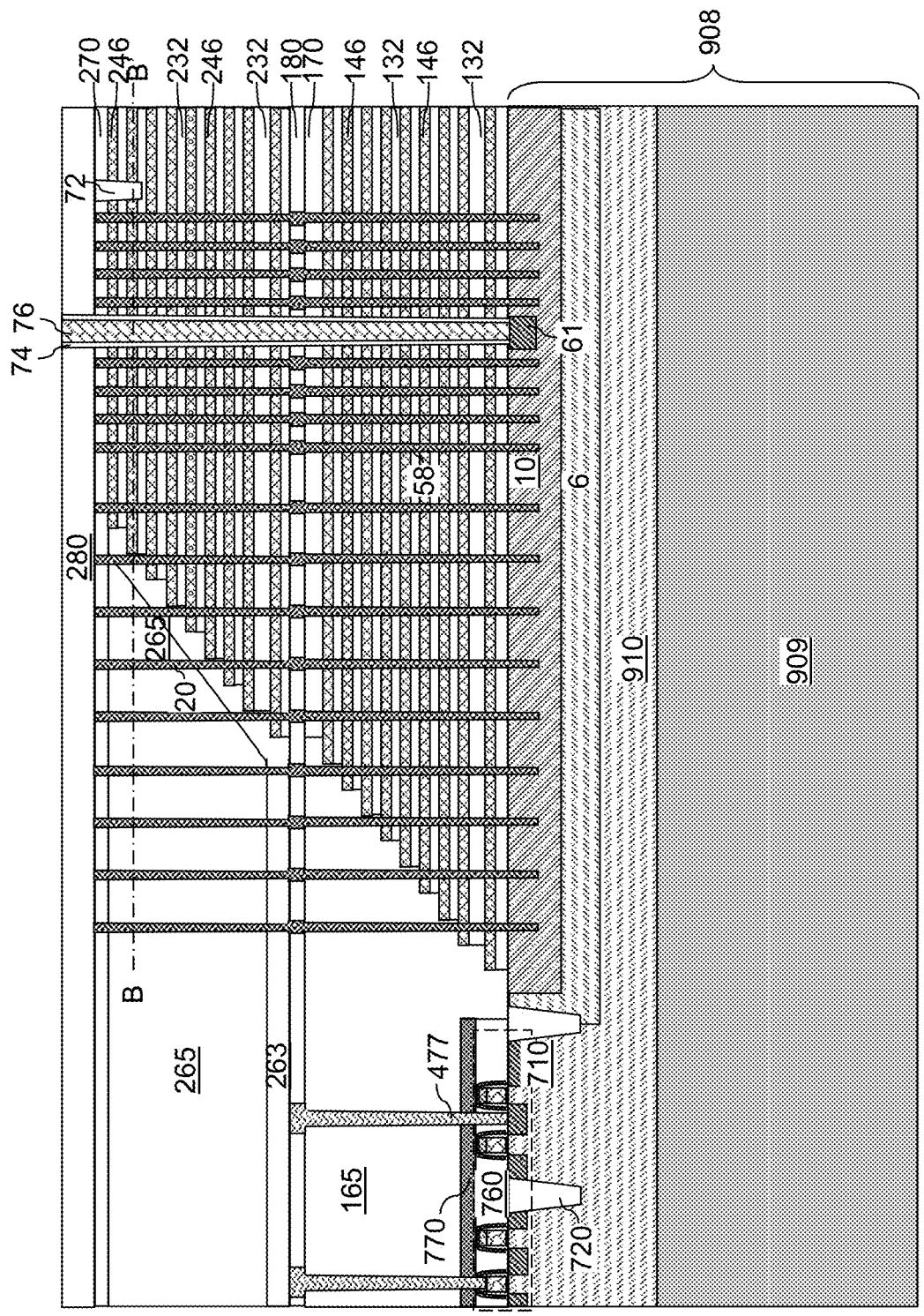
FIG. 17A is a vertical cross-sectional view of a region of the exemplary structure after formation of divider trench fill structures and slit trench fill structures according to an embodiment of the present disclosure.
Figure 17B:
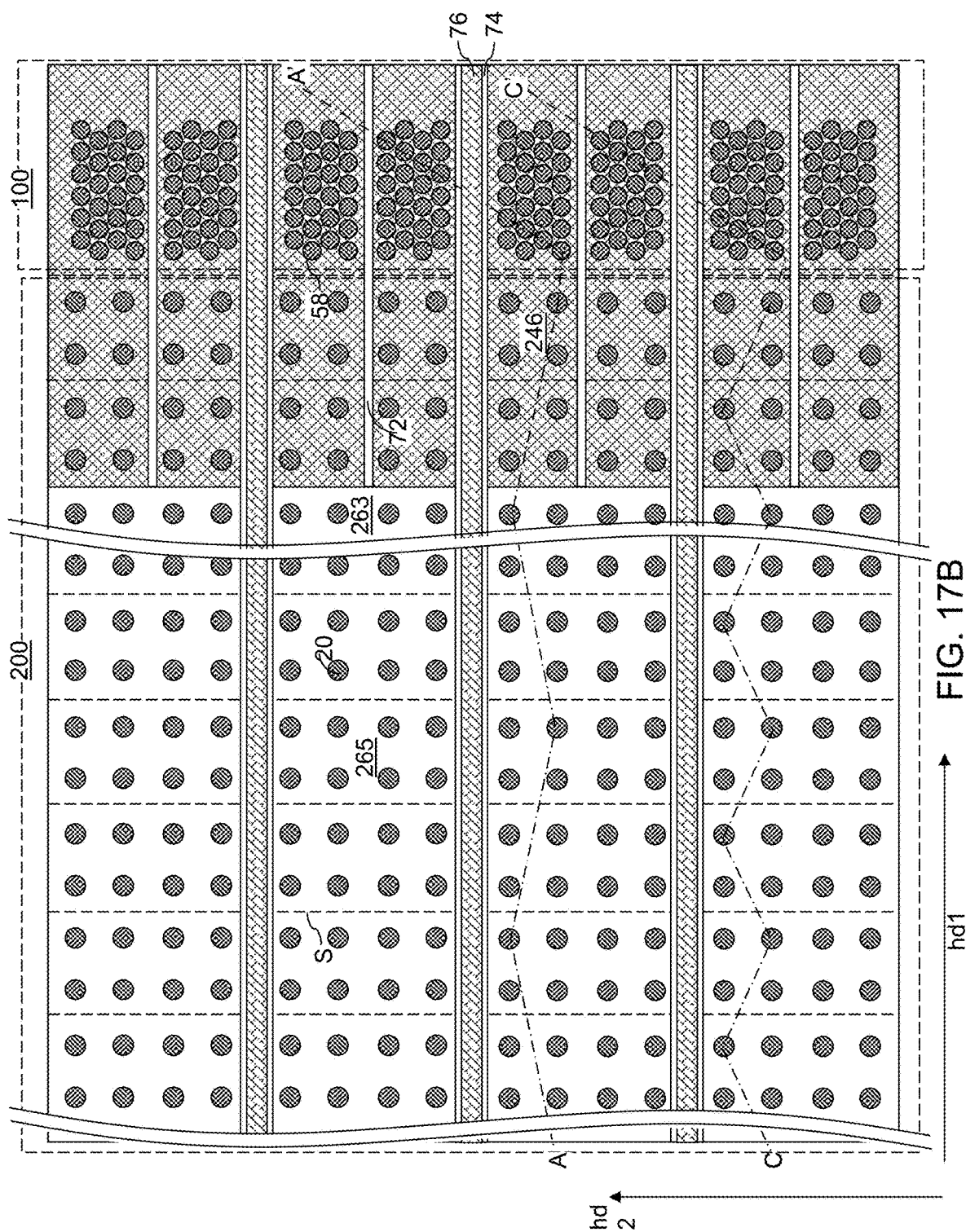
FIG. 17B is a horizontal cross-sectional of a region of the exemplary structure along the horizontal plane B-B' of FIG. 17A. The hinged vertical plane A-A' corresponds to the plane of the vertical cross-sectional view of FIG. 17A.
Figure 17C:
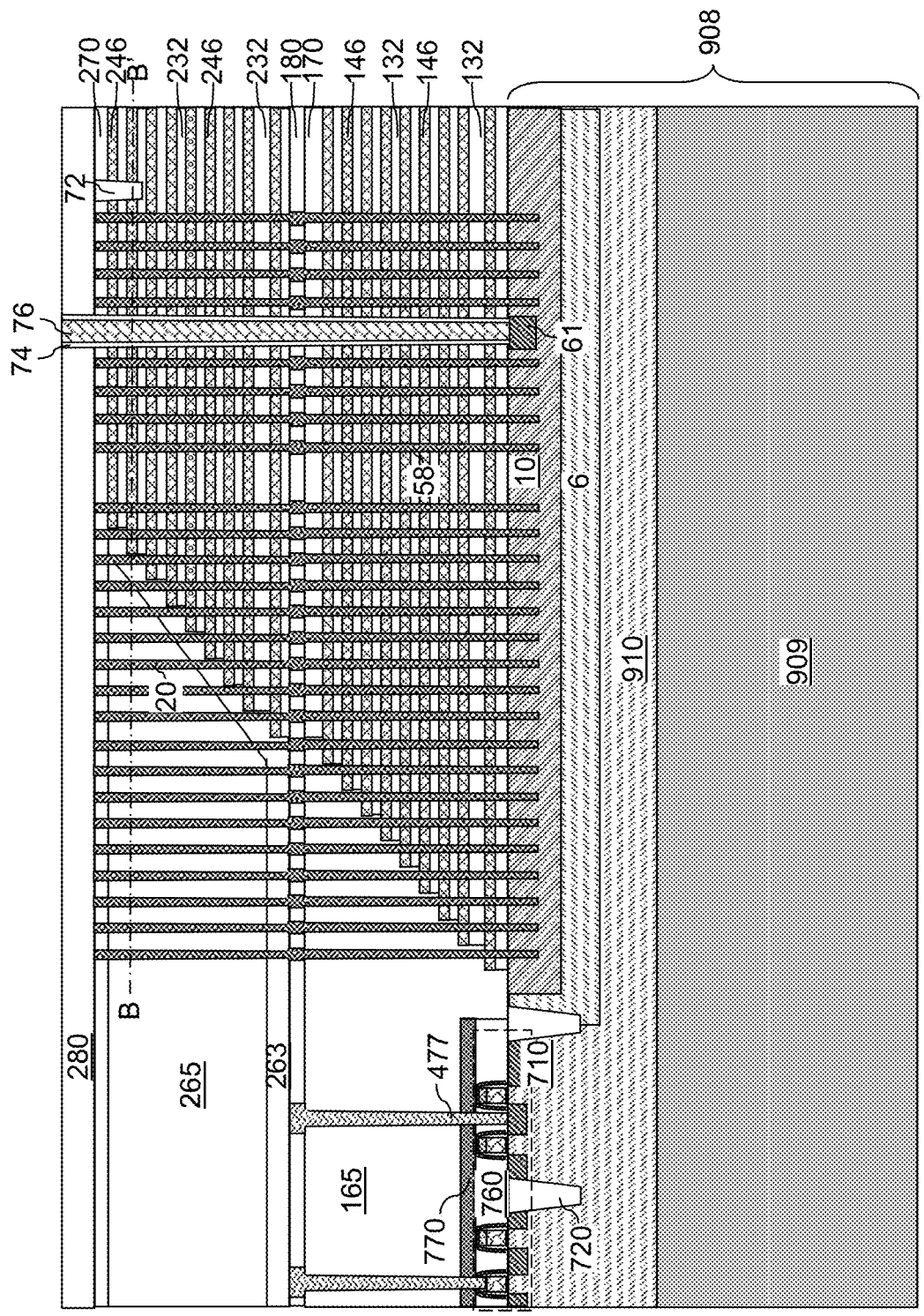
FIG. 17C is a vertical cross-sectional view of the exemplary structure along the vertical plane C-C' of FIG. 17B.

Referring to FIGS. 17A-17C, a conformal dielectric material layer (such as a silicon oxide layer) can be deposited at peripheral portions of the backside trenches 79, and an anisotropic etch process can be performed to remove horizontal portions of the conformal dielectric material layer. Each remaining vertical portion of the conformal dielectric material layer in the backside trenches 79 constitutes a backside trench dielectric spacer 74.

Electrical dopants can be implanted into physically exposed portions of the second doped wells 10 to form source regions 61. In one embodiment, the second doped wells 10 and the vertical semiconductor channels 60 can have a doping of a first conductivity type, and the source regions 61 can have a doping of a second conductivity type that is the opposite of the first conductivity type. For example, the first conductivity type can be p-type and the second conductivity type can be n-type, or vice versa. In case the source regions 61 are formed, the source regions 61 can have an atomic concentration of electrical dopants of the second conductivity type in a range from $5.0 \times 10^{19}/cm^3$ to $2.0 \times 10^{21}/cm^3$.

At least one conductive fill material can be deposited in the remaining volumes of the backside trenches 79. For example, the at least one conductive fill material can include doped polysilicon, a conductive metallic nitride, and/or a metal fill material (such as tungsten). Excess portions of the at least one conductive fill material can be removed from above the horizontal plane including the top surface of the first contact-level dielectric layer 280. Each remaining portion of the at least one conductive fill material in the backside trenches 79 can constitute a source contact via structure 76. Each of the source contact via structures 76 is a conductive fill material portion. The set of all material portions filling a backside trench 79 constitutes a backside trench fill structure (74, 76). In one embodiment, a backside trench fill structure (74, 76) can include a backside trench dielectric spacer 74 and a source contact via structure 76.

A plurality of alternating stacks {(132, 146), (232, 246)} and a plurality of backside trench fill structures (74, 76) are alternately interlaced along the second horizontal direction hd2. In one embodiment, each of the plurality of backside trench fill structures (74, 76) contacts sidewalls of at least one alternating stack {(132, 146), (232, 246)} among the plurality of alternating stacks {(132, 146), (232, 246)} that laterally extend along the first horizontal direction hd1.

Figure 18:
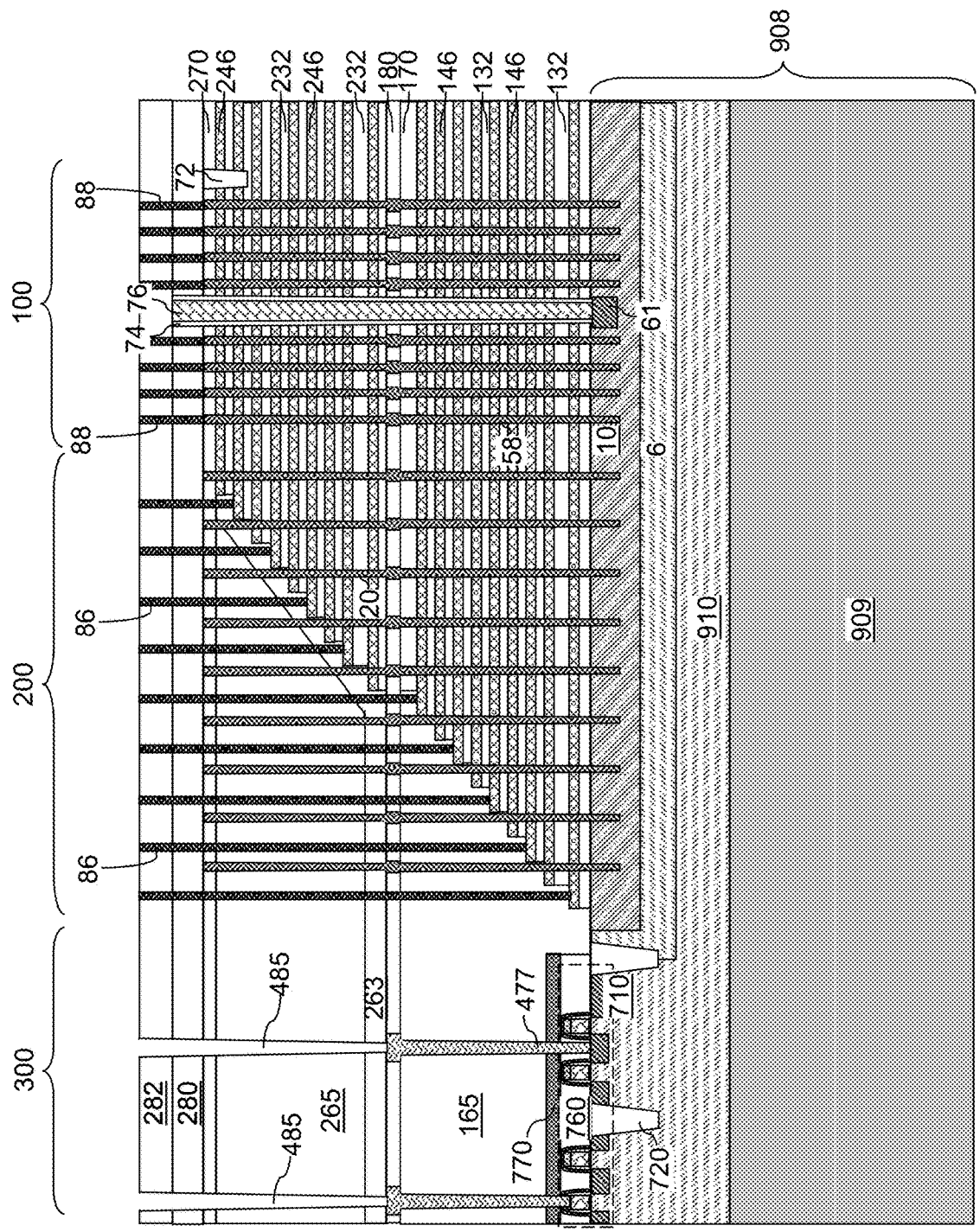
FIG. 18 is a vertical cross-sectional view of a region of the exemplary structure after formation of layer contact via structures, drain contact via structures, and extension via cavities according to an embodiment of the present disclosure.

Referring to FIG. 18, a second contact-level dielectric layer 282 can be optionally formed over the first contact-level dielectric layer 280. The second contact-level dielectric layer 282 includes a dielectric material such as silicon oxide. A photoresist layer (not shown) may be applied over the contact-level dielectric layers (280, 282), and may be lithographically patterned to form various contact via openings therethrough. For example, openings for forming drain contact via structures may be formed over the drain regions 63 in the memory array regions 100, and openings for forming staircase region contact via structures may be formed in the staircase regions 200. An anisotropic etch process is performed to transfer the pattern in the photoresist layer through the contact-level dielectric layers (280, 282) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include source and drain select level contact via structures that contact a subset of the second electrically conductive layers 246 that function as respective source and drain select level gate electrodes. Further, the staircase-region contact via structures 86 may include word line contact via structures that contact electrically conductive layers (146, 246) that overlie the source select level gate electrodes and that underlie the drain select level gate electrodes and function as word lines for the memory stack structures 55.

Extension via cavities 485 can be formed through the contact-level dielectric layers (280, 282) and the second retro-stepped dielectric material portion (265, 263) onto a top surface of a respective one of the sacrificial contact via structures 477. For example, a photoresist layer (not shown) can be applied over the second contact-level dielectric layer 282, and can be lithographically patterned to form openings over areas of the sacrificial contact via structures 477. An anisotropic etch process can be performed to transfer the pattern of the openings in the photoresist layer through the contact-level dielectric layers (280, 282) and the second retro-stepped dielectric material portion (265, 263) onto the top surfaces of the sacrificial contact via structures 477. In one embodiment, sidewalls of the extension via cavities 485 can have a taper angle in a range from 0.1 degree to 3 degrees relative to the vertical direction. The photoresist layer can be subsequently removed, for example, by ashing.

Figure 19:
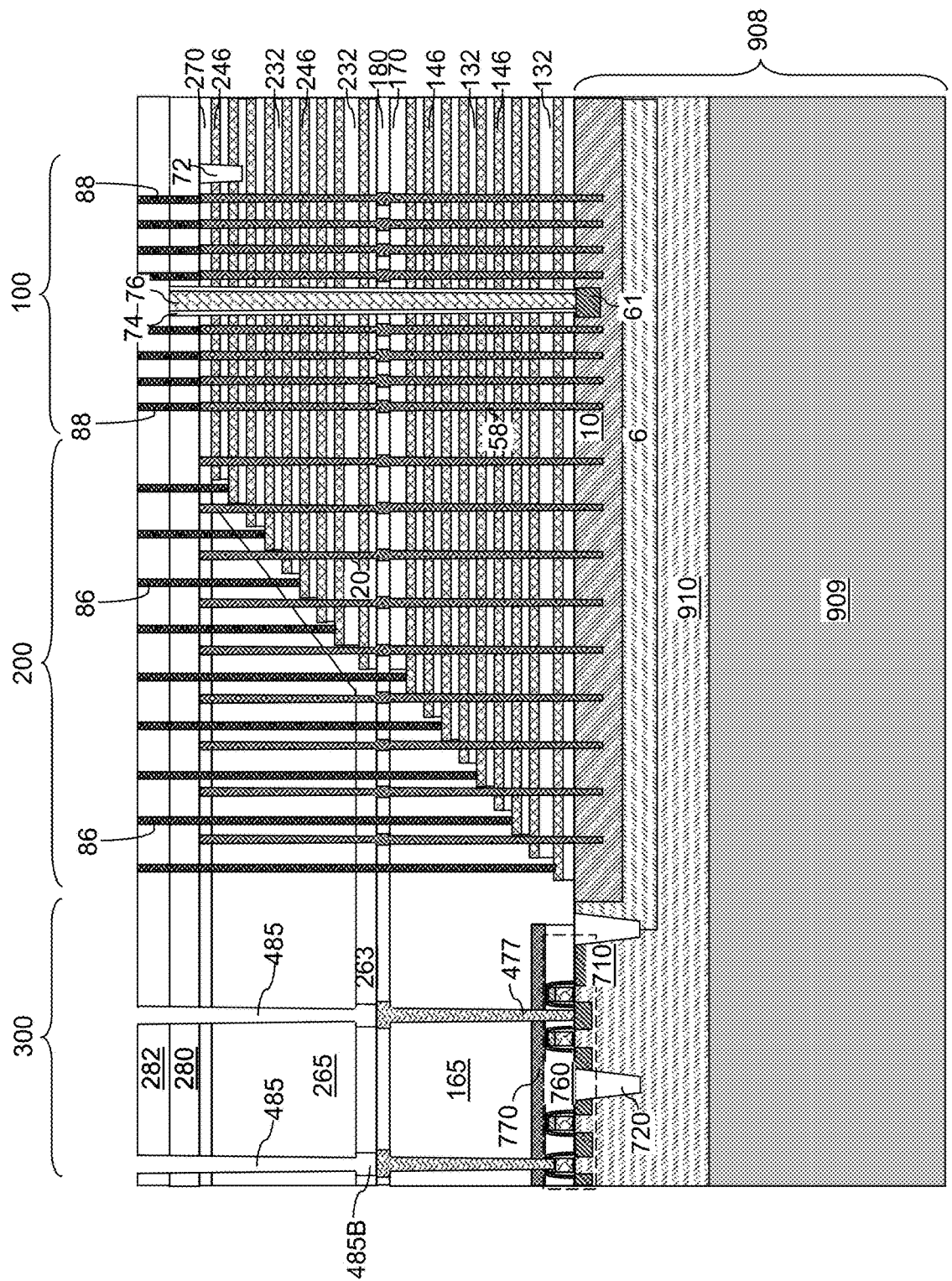
FIG. 19 is a vertical cross-sectional view of a region of the exemplary structure after selective lateral expansion of the extension via cavities according to an embodiment of the present disclosure.

Referring to FIG. 19, an isotropic etch process can be performed to laterally recess physically exposed sidewalls of the doped silicate glass liner 263 without significantly recessing physically exposed sidewalls of the silicate glass material portion 265. In other words, if the physically exposed sidewalls of the silicate glass material portion 265 are recessed, then the physically exposed sidewalls of the doped silicate glass liner 263 are recessed by at least twice as much, such as by 3 to 10,000 times as much. The isotropic etch process can be a wet etch process employing dilute hydrofluoric acid as an etchant. For example, 100:1 dilute hydrofluoric acid or a variant thereof having a different dilution may be employed as the isotropic etchant of the wet etch process. As discussed above, the ratio of the etch rate of the material of the doped silicate glass liner 263 in a 100:1 dilute hydrofluoric acid at room temperature to the etch rate of the material of the silicate glass material portion 265 can be in a range from 3 to 10,000. In one embodiment, the contact-level dielectric layers (280, 282), the second insulating cap layer 270, and the silicate glass material portion 265 can include undoped silicate glass, and the doped silicate glass liner 263 can include borosilicate, phosphosilicate or borophosphosilicate glass.

The portion of each extension via cavity 485 located at the levels of the doped silicate glass liner 263 is widened (i.e., laterally expanded) to form a bulging region 485B. In one embodiment, the lateral recess distance of the sidewalls of the doped silicate glass liner 263 can be selected such that the lateral extent of the bulging portion of each of the extension via cavities 485 is less than the lateral extent of the top surface of a respective underlying sacrificial contact via structure 477. In one embodiment, the entirety of the bottom surface of an extension via cavity 486 can be located within peripheral of a top surface of the respective underlying sacrificial contact via structure 477.

Figure 20:
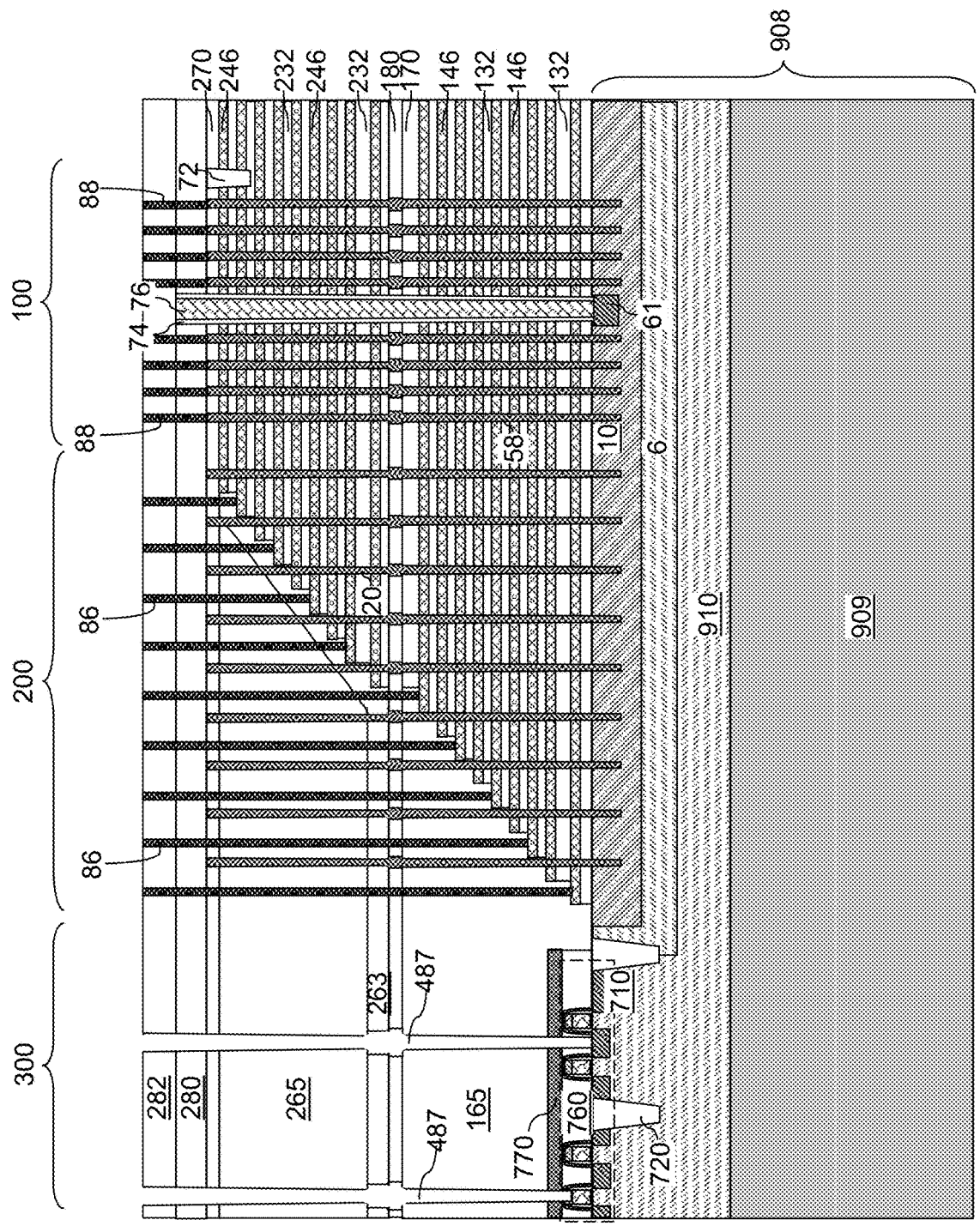
FIG. 20 is a vertical cross-sectional view of a region of the exemplary structure after removal of sacrificial contact via structures and formation of device contact via cavities according to an embodiment of the present disclosure.

Referring to FIG. 20, the extension via cavities 485 can be vertically extended to a top surface of a respective component of the semiconductor devices 710 by removing the sacrificial contact via structures 477 selective to the etch stop dielectric layer 770, the planarization dielectric layer 760, the inter-tier dielectric layer 180, the second retro-stepped dielectric material portion (263, 265), and the contact-level dielectric layers (280, 282). An isotropic etch process can be employed to remove the sacrificial contact via structures 477. For example, if the sacrificial contact via structures 477 include amorphous silicon, a wet etch process employing hot trimethyl-2 hydroxyethyl ammonium hydroxide ("hot TMY") or tetramethyl ammonium hydroxide (TMAH) may be performed to remove the sacrificial contact via structures 477. Alternatively, if the sacrificial contact via structures 477 includes a silicon-germanium alloy, a wet etch process employing a mixture of ammonium hydroxide ($NH_4OH$) and hydrogen peroxide ($H_2O_2$) may be performed to remove the sacrificial contact via structures 477. Each contiguous set of a volume of an extension via cavity 485 and a volume of the void from which a sacrificial contact via structure 477 is removed constitutes a contact via cavity, which is herein referred to as a device contact via cavity 487. A top surface of a respective one of the components of the semiconductor devices 710 can be physically exposed at the bottom of each device contact via cavity 487.

Figure 21:
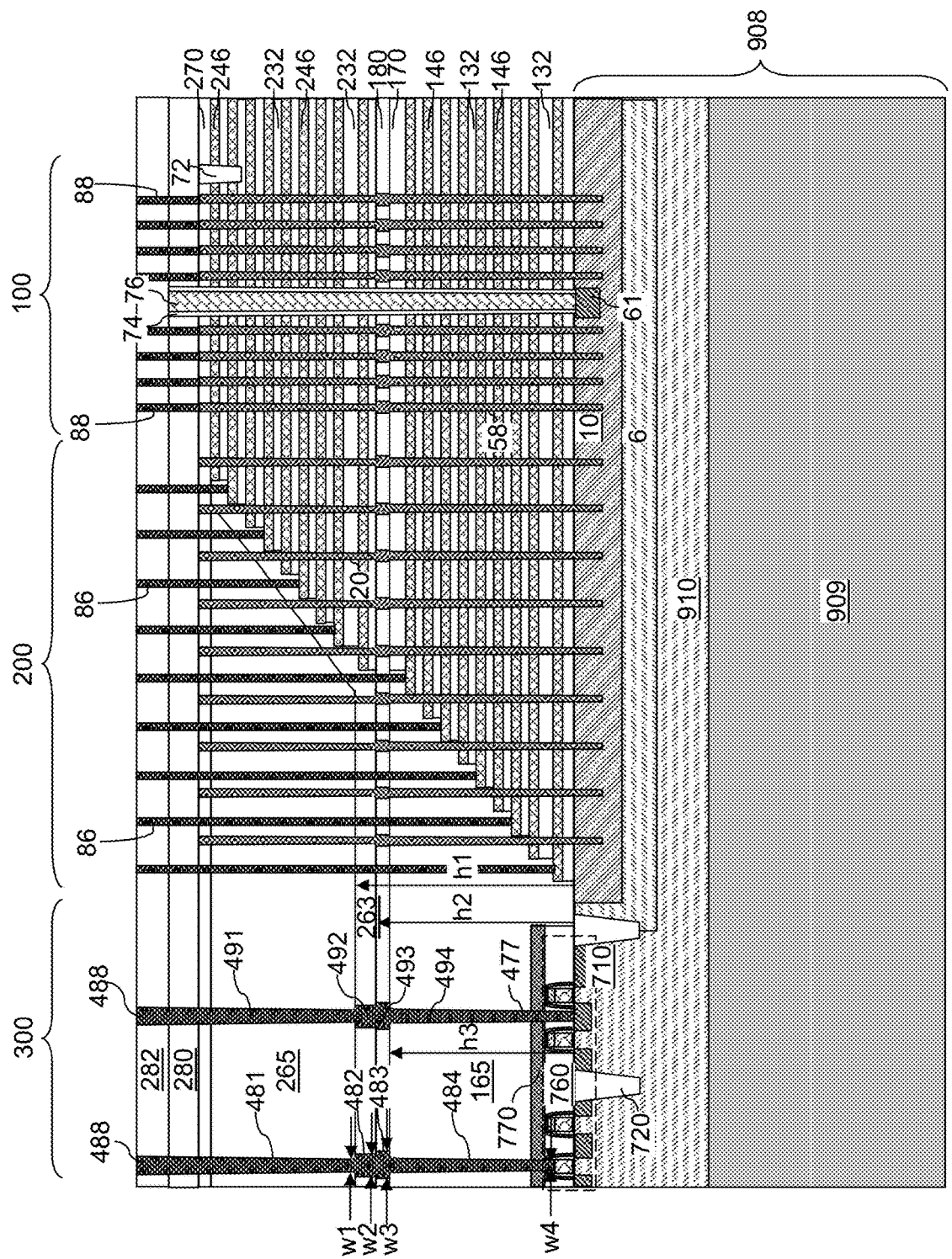
FIG. 21 is a vertical cross-sectional view of a region of the exemplary structure after formation of device contact via structures according to an embodiment of the present disclosure.

Referring to FIG. 21, at least one conductive material may be deposited in the device contact via cavities 487. The at least one conductive material can include, for example, an optional conductive metallic nitride material (such as TiN, TaN, or WN) that is deposited as a metallic barrier layer, and at least one conductive metal (such as W, Cu, Co, Ru, Mo, or alloys or layer stacks thereof) that is deposited over the optional conductive metallic nitride material. Excess portions of the at least one conductive material may be removed from above the horizontal plane including the top surface of the contact-level dielectric layers (280, 282). Each remaining portion of the at least one conductive material in a device contact via cavity 487 constitutes a device contact via structure 488. The device contact via structures 488 can be formed in the peripheral device regions 300. The peripheral device regions 300 may include sense amplifier circuits, word line and select gate electrode switch regions, and miscellaneous peripheral device regions.

In one embodiment, at least one, and/or each, of the device contact via structures 488 can vertically extend at least from a horizontal plane including a topmost surface of at least one retro-stepped dielectric material portion (such as the first and second retro-stepped dielectric material portions (165, 263, 265)) to a component of the field effect transistors. For example, at least one, and/or each, of the contact via structures 488 can vertically extend from a horizontal plane including a topmost surface of the contact-level dielectric layers (280, 282) to a component of the field effect transistors. In one embodiment, such a device contact via structure 488 can have a first portion 491 having a first width w1 at a first height h1 from a horizontal plane including the top surface of the substrate 908, a second portion 492 having second width w2 that is greater than the first width w1 at a second height h2 from the horizontal plane that is less than the first height h1, an optional third portion 493 having a third width w3 that is greater than the first width w1 at a third height h3 from the horizontal plane that is less than the second height h2, and a fourth portion 494 having a width w4 that is less than the second width w2 and is less than the third width w3 at a fourth height h4 at which a bottommost surface of the device contact via structure 488 is located.

The first portion 491 is located over the second portion 492. The second portion 492 is located over the optional third portion 493 and the fourth portion 494. The optional third portion 493 is located over the fourth portion 494. At least a part of the first portion 491 is laterally surrounded by the silicate glass material portion 265. The second portion 492 is laterally surrounded by the doped silicate glass liner 263. The optional third portion 493 is laterally surrounded by the optional inter-tier dielectric layer 180. The fourth portion 494 is at least partially laterally surrounded by the first retro-stepped dielectric material portion 165.

In one embodiment, the device contact via structure 488 comprises a first sidewall 481 of the first portion 491 having a bottom periphery at the first height h1, a second sidewall 482 of the second portion 492 having a top periphery below the first height h1 and a bottom periphery at the second height h2, a third sidewall 483 of the third portion 493 having a top periphery below the second height h2 and a bottom periphery at the third height h3, and a fourth sidewall 484 of the fourth portion 494 having a top periphery below the third height h3 and having a bottom periphery at the fourth height h4.

In one embodiment, the first height h1 can be located above the horizontal plane including the interface between the doped silicate glass liner 263 and the silicate glass material portion 265. The second height h2 can be located below the horizontal plane including the interface between the doped silicate glass liner 263 and the silicate glass material portion 265 and above the horizontal plane between the inter-tier dielectric layer 180 and the doped silicate glass liner 263. The third height h3 can be located below the horizontal plane between the inter-tier dielectric layer 180 and the doped silicate glass liner 263 and above the horizontal plane including the first retro-stepped dielectric material portion 165 and the inter-tier dielectric layer 180.

In one embodiment, the first sidewall 481 can extend through, and contact, the silicate glass material portion 265. The second sidewall 482 can extend through, and contact, the doped silicate glass liner 263. The third sidewall 483 can extend through, and contact, the inter-tier dielectric layer 180. The fourth sidewall 484 can extend through, and contact, the first retro-stepped dielectric material portion 165, the etch stop dielectric layer 770, and the planarization dielectric layer 760.

In one embodiment, the bottom periphery of the first sidewall 481 can be located at, or immediately above, the horizontal plane including the interface between the doped silicate glass liner 263 and the silicate glass material portion 265. The bottom periphery of the second sidewall 482 can be located at, or immediately above, the horizontal plane between the inter-tier dielectric layer 180 and the doped silicate glass liner 263. The bottom periphery of the third sidewall 482 can be located at, or immediately above, the horizontal plane including the first retro-stepped dielectric material portion 165 and the inter-tier dielectric layer 180.

In one embodiment, a device contact via structure 488 can comprise a first annular horizontal surface located at the first height h1 and connecting the bottom periphery of the first sidewall 481 and the top periphery of the second sidewall 482. The lateral distance between the bottom periphery of the first sidewall 481 and the top periphery of the second sidewall 482 can be uniform throughout an entirety of the first annular horizontal surface because an isotropic etch process is employed to laterally expand the bottom portion of each connection via cavity 495 at the processing steps of FIG. 19.

In one embodiment, the device contact via structure 488 comprises a second annular horizontal surface located at the second height h2 and connecting the bottom periphery of the second sidewall 482 and the top periphery of the third sidewalls 483. The lateral distance between the bottom periphery of the second sidewall 482 and the top periphery of the third sidewall 483 may, or may not, be uniform. Specifically, the lateral distance between the bottom periphery of the second sidewall 482 and the top periphery of the third sidewall 483 can be uniform if the geometrical center of a connection via cavity 485 at the processing steps of FIG. 18 is aligned to an underlying sacrificial contact via structure 477 without zero overlay error during a lithographic patterning process that defines the location of the connection via cavity 485. The lateral distance between the bottom periphery of the second sidewall 482 and the top periphery of the third sidewall 483 can be nonuniform if the geometrical center of a connection via cavity 485 at the processing steps of FIG. 18 is not aligned to an underlying sacrificial contact via structure 477 due to a non-zero overlay shift distance during a lithographic patterning process that defines the location of the connection via cavity 485. In this case, the lateral distance between the bottom periphery of the second sidewall 482 and the top periphery of the third sidewall 483 can be nonuniform within the second annular horizontal surface.

In one embodiment, the first sidewall 481 and the fourth sidewall 484 can have taper angles in a range from 0.1 degree to 3 degrees. In one embodiment, the third width w3 can be greater than the second width w2.

Figure 22:
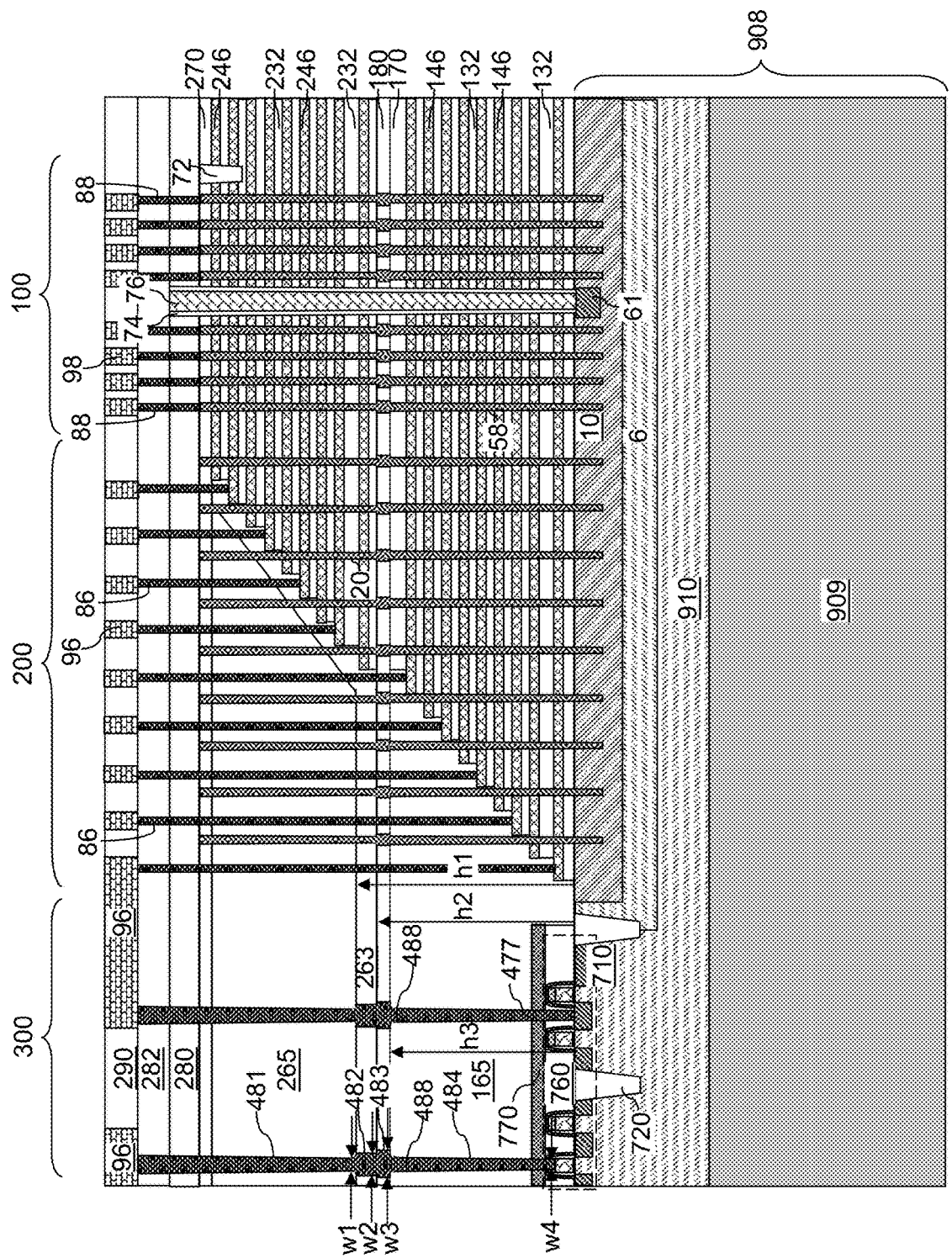
FIG. 22 is a vertical cross-sectional view of a region of the exemplary structure after formation of a bit-line-level dielectric layer and bit-line-level metal interconnect structures according to an embodiment of the present disclosure.

Referring to FIG. 22, a bit-line-level dielectric layer 290 can be formed over the contact-level dielectric layers (280, 282). The bit-line-level metal structures (98, 96) can be formed in the bit-line-level dielectric layer 290. The bit-line-level metal structures (98, 96) may include bit lines 98 electrically contacting a respective one of the drain contact via structures 88, and word line interconnection line structures 96 contacting, and/or electrically connected to, at least one of the staircase-region contact via structures 86 and/or the device contact via structures 488. Additional dielectric material layers (not shown) and additional metal interconnect structures (not shown) can be formed above the bit-line-level dielectric layer 290.

Figure 23:
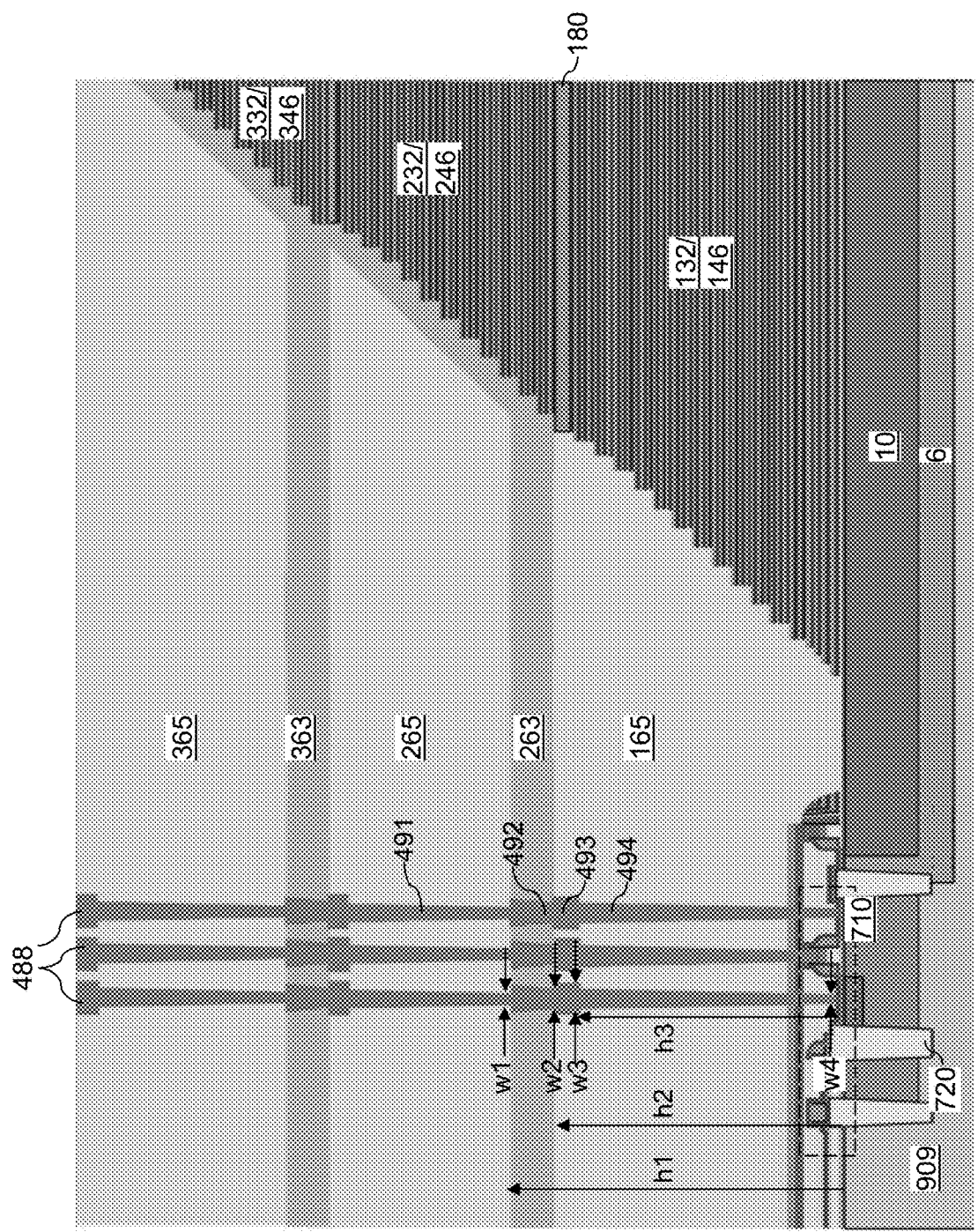
FIG. 23 is a vertical cross-sectional view of another exemplary structure that employs three alternating stacks of insulating layers and electrically conductive layers according to an embodiment of the present disclosure.

Referring to FIG. 23, another exemplary structure according to an embodiment of the present disclosure is illustrated, which includes three alternating stacks of insulating layers and electrically conductive layers. In this case, a third-tier structure is formed over the second-tier structure. The third-tier structure includes a third alternating stack of third insulating layers 332 and third electrically conductive layers 446, and a third retro-stepped dielectric material portion (363, 365) is formed over third stepped surfaces. The third retro-stepped dielectric material portion (363, 365) can include a doped silicate glass liner 363 and a silicate glass material portion 365. The doped silicate glass liner 363 can have the same material composition as the doped silicate glass liner 263, and the silicate glass material portion 365 can have the same material composition as the silicate glass material portion 265. An additional inter-tier dielectric layer (which is herein referred to as a second inter-tier dielectric layer) can be formed between the second retro-stepped dielectric material portion (263, 265) and the third retro-stepped dielectric material portion (363, 365). Yet another inter-tier dielectric layer (which is herein referred to as a third inter-tier dielectric layer) can be formed on the top surface of the third retro-stepped dielectric material portion (363, 365), upon which the contact-level dielectric layers (280, 282) can be subsequently formed. The second inter-tier dielectric layer and the third inter-tier dielectric layer may have the same material composition and the same thickness as the inter-tier dielectric layer 180 described above (which is referred to as a first inter-tier dielectric layer when multiple inter-tier dielectric layers are present). Bulging features of the device contact via structures 488 can be present at each level of the doped silicate glass liners and at each level of the inter-tier insulating layers.

Referring to all drawings and according to various embodiments of the present disclosure, a semiconductor structure is provided, which comprises: field effect transistors located on a substrate 908; a three-dimensional memory array located over the substrate 908, wherein the three-dimensional memory array comprises at least one alternating stack of insulating layers (132, 232, 332) and electrically conductive layers (146, 246, 346) and memory stack structures 55 that vertically extend through the at least one alternating stack, and wherein the at least one alternating stack comprises stepped surfaces in a staircase region 200; at least one retro-stepped dielectric material portion (165, 263, 265, 363, 365) overlying the stepped surfaces and the field effect transistors; and a contact via structure (such as the device contact via structure 488) extending at least from a horizontal plane including a topmost surface of the at least one retro-stepped dielectric material portion (165, 263, 265, 363, 365) to a component of the field effect transistors and having the geometrical features described above.

In one embodiment, the at least one alternating stack comprises a first-tier alternating stack of first insulating layers 132 and first electrically conductive layers 146, and a second-tier alternating stack of second insulating layers 232 and second electrically conductive layers 246, wherein the second-tier alternating stack is more distal from the substrate 908 than the first-tier alternating stack is from the substrate 908; and the at least one retro-stepped dielectric material portion (165, 263, 265, 363, 365) comprises a first retro-stepped dielectric material portion 165 contacting, and overlying, stepped surfaces of the first-tier alternating stack, and a second retro-stepped dielectric material portion (263, 265) contacting, and overlying, stepped surfaces of the second-tier alternating stack.

In one embodiment, the second retro-stepped dielectric material portion (263, 265) comprises: a doped silicate glass liner 263 including a sloping portion 263S that contacts the stepped surfaces of the second-tier alternating stack; and a silicate glass material portion 265 overlying the doped silicate glass liner 263 and including a planar top surface and a tapered portion 265T overlying, and vertically spaced from, the stepped surfaces of the second-tier alternating stack.

In one embodiment, a horizontal plane including an interface between the doped silicate glass liner 263 and the silicate glass material portion 265 is at the first height h1 from the substrate 908. In one embodiment, the semiconductor structure comprises a first inter-tier dielectric layer 180 located between the first retro-stepped dielectric material portion 165 and the doped silicate glass liner 263, wherein an interface between the first inter-tier dielectric layer 180 and the doped silicate glass liner 263 is located at the second height h2.

In one embodiment, a ratio of an etch rate of a material of the doped silicate glass liner 263 in a 100:1 dilute hydrofluoric acid at room temperature to an etch rate of a material of the silicate glass material portion 265 is in a range from 10 to 10,000. In one embodiment, a ratio of the etch rate of the material of the doped silicate glass liner 263 in a 100:1 dilute hydrofluoric acid at room temperature to an etch rate of a material of the first inter-tier dielectric layer 180 at room temperature is in a range from 3 to 10,000.

In another embodiment, a semiconductor structure includes field effect transistors 710 located on a substrate 908 and a three-dimensional memory array located over the substrate, wherein the three-dimensional memory array comprises a first-tier alternating stack (132, 246) of first insulating layers and first electrically conductive layers, a second-tier alternating stack (232, 246) of second insulating layers and second electrically conductive layers located over the first-tier alternating stack, and memory stack structures 55 comprising a vertical semiconductor channel 60 and a memory film 50 that vertically extend through the first and the second alternating stacks. A retro-stepped dielectric material portion 165 contacts, and overlies, stepped surfaces of the first-tier alternating stack (132, 246). A doped silicate glass liner 263 includes a sloping portion that contacts the stepped surfaces of the second-tier alternating stack (232, 246). A silicate glass material portion 265 overlies the doped silicate glass liner 263 and includes a planar top surface and a tapered portion overlying, and vertically spaced from, the stepped surfaces of the second-tier alternating stack (232,

246). A contact via structure 488 extends to a component of the field effect transistors 710. The contact via structure 488 comprises a middle portion (e.g., second portion 492) that is laterally surrounded by the doped silicate glass liner 263 that is wider than a lower portion (e.g., fourth portion 494) that is at least partially surrounded by the retro-stepped dielectric material portion 165 and wider than an upper portion (e.g., first portion 491) that is at least partially surrounded by the silicate glass material portion 265.

The laterally bulging portion 485B of the device contact via cavity 487 at the level of each doped silicate glass liner (263, 363) provides an additional stepwise increase in the lateral extent of the device contact via cavity 487 between the region at the bottom of a silicate glass material portion (265, 365) and the region at the level of each underlying inter-tier dielectric layer (such as the inter-tier dielectric layer 180). Thus, the device contact via structure 488 can be formed without any void in the fourth portion 494, or with a void having a reduced size. In other words, the device contact via structure 488 of the embodiments of the present disclosure can be more conformally filled at the bottom of the device via cavity 487 due to wider bulging portion 485B at the level(s) of the silicate glass material portion(s) (265, 365). More conductive fill material is present at the bottommost portion 494 of the device contact via structure 488 that contacts a respective component of an underlying semiconductor device 710. Thus, the device contact via structure 488 of the embodiments of the present disclosure can provide a low-resistance electrical connection path to an underlying semiconductor device 710 with higher contact yield and enhanced device reliability.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure, comprising:
    field effect transistors located on a substrate;
    a three-dimensional memory array located over the substrate, wherein the three-dimensional memory array comprises at least one alternating stack of insulating layers and electrically conductive layers and memory stack structures comprising a vertical semiconductor channel and a memory film that vertically extend through the at least one alternating stack, and wherein the at least one alternating stack comprises stepped surfaces in a staircase region;
    at least one retro-stepped dielectric material portion overlying the stepped surfaces and the field effect transistors; and
    a contact via structure extending from a first horizontal plane including a topmost surface of the at least one retro-stepped dielectric material portion to a component of the field effect transistors,
    wherein the contact via structure has:
        a first portion having a first width at a first height from a second horizontal plane including the top surface of the substrate;
        a second portion having a second width that is greater than the first width at a second height from the second horizontal plane that is less than the first height;
        a third portion having a third width that is greater than the first width at a third height from the second horizontal plane that is less than the second height; and
        a fourth portion having a fourth width that is less than the second width and is less than the third width at a fourth height at which a bottommost surface of the contact via structure is located,
    wherein the at least one alternating stack comprises a first-tier alternating stack of first insulating layers and first electrically conductive layers, and a second-tier alternating stack of second insulating layers and second electrically conductive layers, wherein the second-tier alternating stack is located over the first-tier alternating stack,
    wherein the at least one retro-stepped dielectric material portion comprises a first retro-stepped dielectric material portion contacting, and overlying, stepped surfaces of the first-tier alternating stack, and a second retro-stepped dielectric material portion contacting, and overlying, stepped surfaces of the second-tier alternating stack, and
    wherein the second retro-stepped dielectric material portion comprises:
        a doped silicate glass liner including a sloping portion that contacts the stepped surfaces of the second-tier alternating stack; and
        a silicate glass material portion overlying the doped silicate glass liner and including a planar top surface and a tapered portion overlying, and vertically spaced from, the stepped surfaces of the second-tier alternating stack.

2. The semiconductor structure of claim 1, wherein a horizontal plane including an interface between the doped silicate glass liner and the silicate glass material portion is at the first height from the substrate.

3. The semiconductor structure of claim 2, further comprising a first inter-tier dielectric layer located between the first retro-stepped dielectric material portion and the doped silicate glass liner, wherein an interface between the first inter-tier dielectric layer and the doped silicate glass liner is located at the second height.

4. The semiconductor structure of claim 3, wherein:
    the doped silicate glass liner comprises borosilicate glass, phosphosilicate glass, borophosphosilicate glass or carbon doped glass;
    the silicate glass material portion and the first inter-tier dielectric layer comprise undoped silicon oxide; and
    a ratio of an etch rate of a material of the doped silicate glass liner in hydrofluoric acid to an etch rate of a material of the silicate glass material portion and the material of the first inter-tier dielectric layer is in a range from 3 to 10,000.

5. A semiconductor structure comprising:
    field effect transistors located on a substrate;

a three-dimensional memory array located over the substrate, wherein the three-dimensional memory array comprises a first-tier alternating stack of first insulating layers and first electrically conductive layers, a second-tier alternating stack of second insulating layers and second electrically conductive layers located over the first-tier alternating stack, and memory stack structures comprising a vertical semiconductor channel and a memory film that vertically extend through the first and the second alternating stacks;

a retro-stepped dielectric material portion contacting, and overlying, stepped surfaces of the first-tier alternating stack;

doped silicate glass liner including a sloping portion that contacts stepped surfaces of the second-tier alternating stack;

a silicate glass material portion overlying the doped silicate glass liner and including a planar top surface and a tapered portion overlying, and vertically spaced from, the stepped surfaces of the second-tier alternating stack; and a contact via structure extending to a component of the field effect transistors, wherein the contact via structure comprises a middle portion that is laterally surrounded by the doped silicate glass liner that is wider than a lower portion that is at least partially surrounded by the retro-stepped dielectric material portion and wider than an upper portion that is at least partially surrounded by the silicate glass material portion.

6. The semiconductor structure of claim 5, further comprising a first inter-tier dielectric layer located between the first retro-stepped dielectric material portion and the doped silicate glass liner.

7. The semiconductor structure of claim 6, wherein:

a horizontal plane including an interface between the doped silicate glass liner and the silicate glass material portion is located at a first height from the substrate; and an interface between the first inter-tier dielectric layer and the doped silicate glass liner is located at a second height from the substrate which is less than the first height.

8. The semiconductor structure of claim 7, wherein:

the doped silicate glass liner comprises borosilicate glass, phosphosilicate glass, borophosphosilicate glass or carbon doped glass;

the silicate glass material portion and the first inter-tier dielectric layer comprise undoped silicon oxide; and a ratio of an etch rate of a material of the doped silicate glass liner in hydrofluoric acid to an etch rate of a material of the silicate glass material portion and the material of the first inter-tier dielectric layer is in a range from 3 to 10,000.

* * * * *